United States Patent
Lee

(10) Patent No.: US 10,623,675 B2
(45) Date of Patent: Apr. 14, 2020

(54) IMAGE SENSOR INCLUDING AT LEAST ONE AUTOFOCUSING PIXEL AND AT LEAST ONE NORMAL PIXEL AND DRIVING METHOD THEREOF

(71) Applicant: Samsung Electronics Co., Ltd., Suwon-si, Gyeonggi-do (KR)

(72) Inventor: Kyung Ho Lee, Suwon-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 16/366,336

(22) Filed: Mar. 27, 2019

(65) Prior Publication Data

US 2019/0222785 A1    Jul. 18, 2019

Related U.S. Application Data

(63) Continuation of application No. 15/461,929, filed on Mar. 17, 2017, now Pat. No. 10,270,996.

(30) Foreign Application Priority Data

Aug. 30, 2016  (KR) .................. 10-2016-0111089

(51) Int. Cl.
| | | |
|---|---|---|
| *H04N 5/369* | (2011.01) | |
| *H04N 5/232* | (2006.01) | |
| *H01L 27/146* | (2006.01) | |
| *H04N 5/04* | (2006.01) | |
| *H04N 5/374* | (2011.01) | |

(Continued)

(52) U.S. Cl.
CPC ..... *H04N 5/3696* (2013.01); *H01L 27/14621* (2013.01); *H01L 27/14627* (2013.01); *H01L 27/14645* (2013.01); *H04N 5/04* (2013.01); *H04N 5/23212* (2013.01); *H04N 5/374* (2013.01); *H04N 9/045* (2013.01); *H04N 9/077* (2013.01)

(58) Field of Classification Search
CPC .. H04N 5/3696; H04N 5/23212; H04N 5/374; H04N 9/045; H04N 9/077; H04N 5/04; H01L 27/14621; H01L 27/14645; H01L 27/14627

See application file for complete search history.

(56) References Cited

U.S. PATENT DOCUMENTS 8,350,935 B2    1/2013    Kim et al.
8,593,563 B2    11/2013   Shintani
(Continued)

FOREIGN PATENT DOCUMENTS

| JP | 5759421 B | 1/2014 |
|---|---|---|
| JP | 2014075393 A | 4/2014 |
| JP | 2016054227 A | 4/2016 |

*Primary Examiner* — Gevell V Selby
(74) *Attorney, Agent, or Firm* — Harness, Dickey & Pierce, P.L.C.

(57) ABSTRACT

An image sensor according to some example embodiments includes a pixel array unit including a plurality of transmission signal lines and a plurality of output signal lines, and a plurality of pixels connected to the plurality of transmission signal lines and the plurality of output signal lines. Each of the plurality of pixels includes a plurality of photoelectric conversion elements, which are configured to detect and photoelectrically convert incident light. The plurality of pixels include at least one autofocusing pixel and at least one normal pixel.

19 Claims, 24 Drawing Sheets

(51) Int. Cl.
*H04N 9/04* (2006.01)
*H04N 9/077* (2006.01)

(56) References Cited

U.S. PATENT DOCUMENTS

| | | | |
|---|---|---|---|
| 9,117,711 | B2 | 8/2015 | Suzuki et al. |
| 9,288,380 | B2 | 3/2016 | Nomura |
| 2011/0096212 | A1* | 4/2011 | Oikawa .............. H04N 5/23212 348/273 |
| 2012/0147227 | A1 | 6/2012 | Yoshimura et al. |
| 2013/0113966 | A1 | 5/2013 | Arishima et al. |
| 2013/0335533 | A1 | 12/2013 | Yamazaki |
| 2014/0327798 | A1 | 11/2014 | Takakusagi |
| 2015/0002838 | A1* | 1/2015 | Fukuda .............. H04N 5/23212 356/123 |
| 2015/0221691 | A1 | 8/2015 | Watanabe |
| 2015/0234148 | A1* | 8/2015 | Kusaka .............. H04N 5/23212 348/349 |
| 2015/0296125 | A1* | 10/2015 | Kusaka .............. H04N 5/23212 348/349 |
| 2016/0014353 | A1 | 1/2016 | Lee et al. |
| 2016/0064430 | A1 | 3/2016 | Lee et al. |

\* cited by examiner

IMAGE SENSOR INCLUDING AT LEAST ONE AUTOFOCUSING PIXEL AND AT LEAST ONE NORMAL PIXEL AND DRIVING METHOD THEREOF

CROSS-REFERENCE TO RELATED APPLICATION

This application is a continuation application of U.S. application Ser. No. 15/461,929, filed on Mar. 17, 2017, which claims priority under 35 U.S.C. § 119 to Korean Patent Application No. 10-2016-0111089, filed in the Korean Intellectual Property Office on Aug. 30, 2016, the entire contents of which are incorporated herein by reference.

BACKGROUND

(a) Technical Field

The present disclosure relates to an image sensor and/or a driving method thereof.

(b) Description of Related Art

An electronic device, such as a digital camera and a smart phone, having a function of photographing an image may include an image sensor. The image sensor may include a charged coupled device (CCD) image sensor, a complementary metal oxide semiconductor (CMOS) image sensor, and the like as a semiconductor device for converting optical information into an electric signal. Among them, the CMOS image sensor is mainly used.

The CMOS image sensor includes a photoelectric conversion element and a plurality of pixels including a plurality of transistors. A signal photoelectrically converted by the photoelectric conversion element may be processed and output by the plurality of transistors, and image data may be generated based on a pixel signal output from the pixel. Each pixel may photoelectrically convert light of a specific color or in a specific wavelength range, and output a signal according to the photoelectrically converted light.

An electronic device having a function of photographing an image may have an autofocusing control function using an image sensor in order to control the focus. A phase difference detection method among various autofocusing control methods may determine whether an image is focused by dividing light incident to a pixel of a sensor into two or more elements of light and comparing the two or more elements of light. According to a result of the determination of whether the image is in focus, the focus may be automatically controlled by moving a photographing optical system included in an electronic device.

The above information disclosed in this Background section is only for enhancement of understanding of the background of inventive concepts. Therefore, it may contain information that does not qualify as prior art.

SUMMARY

Inventive concepts relate to improving a sensitivity of an image sensor and/or further improving a resolution of an image sensor. Inventive concepts also relate to reducing a read time of a pixel signal in an image sensor having a phase difference detection function for an autofocusing control function, and obtain a high reading speed even in an image sensor having high resolution. Inventive concepts also relate to increasing sensitivity of phase difference detection and increasing precision of an autofocusing control of objects with all of the colors.

In some example embodiments, an image sensor includes a pixel array unit including a plurality of pixels connected to a plurality of transmission signal lines and a plurality of output signal lines. Each of the plurality of pixels includes a plurality of photoelectric conversion elements that are configured to detect and photoelectrically convert incident light. The plurality of pixels includes at least one autofocusing pixel and at least one normal pixel.

In some example embodiments, a method of driving an image sensor is provided. The image sensor includes a plurality of pixels. The plurality of pixies include at least one autofocusing pixel and at least one normal pixel. Each of the plurality of pixels include a plurality of photoelectric conversion elements. The method includes reading out autofocusing pixel signals, which are photoelectrically converted by the plurality of photoelectric conversion elements included in one of the at least one autofocusing pixel, respectively, at different timings, and reading out normal pixel signals, which are photoelectrically converted by the plurality of photoelectric conversion elements included in one of the at last one normal pixel, respectively, simultaneously.

In some example embodiments, an image sensor includes a pixel array unit. The pixel array unit includes a plurality of pixels connected to a plurality of transmission signal lines and a plurality of output signal lines. Each of the plurality of pixels includes a plurality of photoelectric conversion elements that are configured to detect and photoelectrically convert incident light. Four pixels adjacent to each other in a quadrangular shape among the plurality of pixels define one pixel unit. The pixel unit includes at least one autofocusing pixel and at least one normal pixel.

According to some example embodiments, an image sensor includes a plurality of pixel units, a plurality of transmission signal lines, a plurality of output signal lines, and a signal processing unit connected to the plurality of pixel units through the plurality of transmission signal lines and the plurality of output signal lines. Each of the plurality of pixel units includes a plurality of pixels that each include a plurality of photoelectric conversion elements. Each of the plurality of pixel units includes an autofocusing pixel and a normal pixel among the plurality of pixels. The signal processing unit is configured to determine corresponding to an external object based on activing two of the plurality of photoelectric conversion elements in the autofocusing pixel differently during a time interval.

According to some example embodiments, it is possible to increase sensitivity of an image sensor and decrease crosstalk, thereby further increasing resolution of the image sensor. Further, it is possible to decrease a read time of a pixel signal in an image sensor having a phase difference detection function for an autofocusing control function, thereby obtaining a high reading speed even in an image sensor having high resolution. Further, it is possible to increase precision of phase difference detection and autofocusing control of objects with all of the colors.

DETAILED DESCRIPTION

Figure 1:
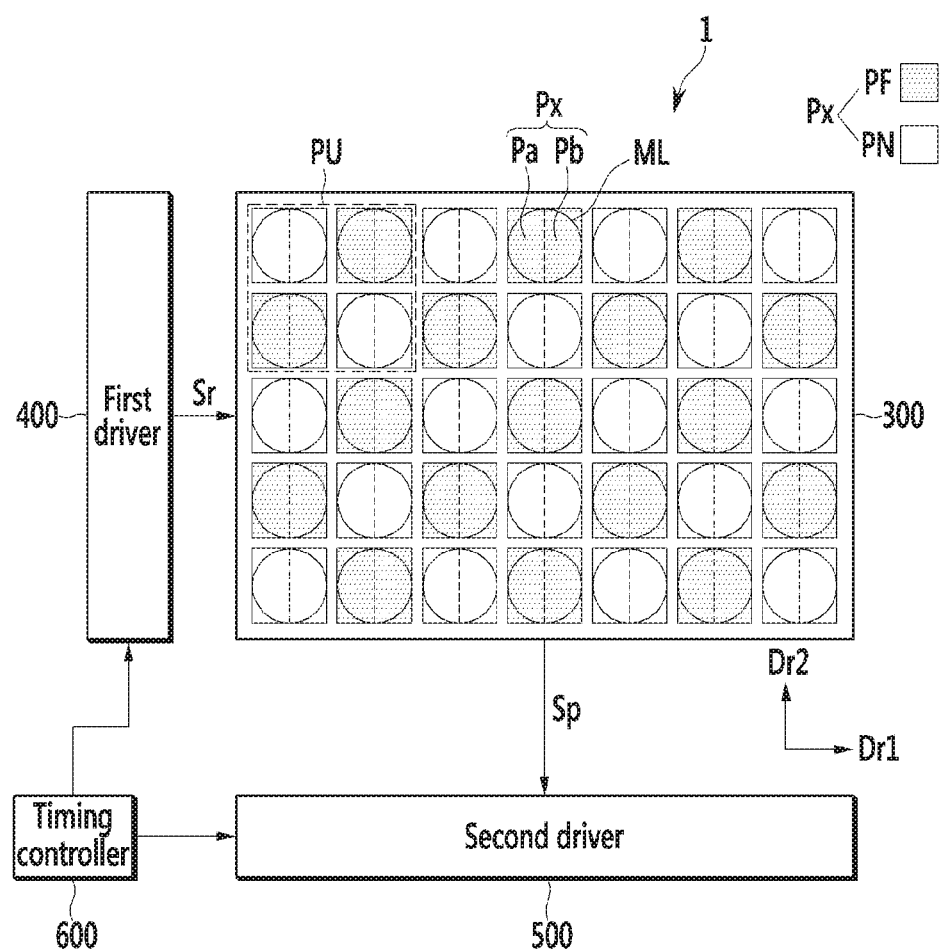
FIG. 1 is a block diagram of an image sensor according to some example embodiments.

An image sensor according to some example embodiments will be described with reference to FIGS. 1 and 2.

An image sensor 1 according to some example embodiments includes a pixel array unit 300, a first driver 400, a second driver 500, and a timing controller 600.

The pixel array unit 300 includes a plurality of pixels Px and a plurality of signal lines (not illustrated). The plurality of pixels Px may be arranged in a matrix form, but is not limited thereto. When the plurality of pixels Px may be arranged in a matrix form, a row direction is referred to as a first direction Dr1, and a column direction is referred to as a second direction Dr2. A direction vertical to both the first direction Dr1 and the second direction Dr2 is referred to as a third direction Dr3.

Each pixel Px may receive a driving signal Sr from the first driver 400, and convert incident light into an electric signal and generate and output a pixel signal Sp. The driving signal Sr may include a selection signal, a reset signal, a transmission signal, and the like.

Each pixel Px may include a plurality of sub areas Pa and Pb each of which includes a plurality of photoelectric conversion elements. The plurality of photoelectric conversion elements positioned in each of the plurality of sub areas Pa and Pb may be spaced apart from each other in a plane structure, and each photoelectric conversion element may detect and photoelectrically convert incident light. The photoelectric conversion element may be, for example, a photodiode, a pinned photodiode, a photogate, and/or a phototransistor. The description below is given based on a case where the photoelectric conversion element is a photodiode as an example.

Figure 2:
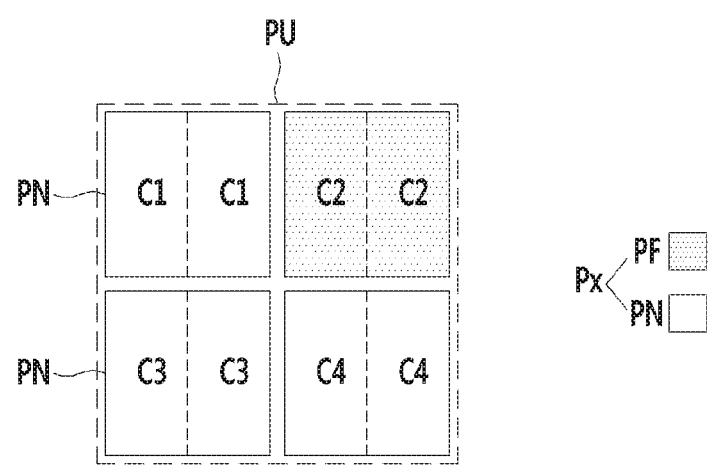
FIGS. 2 to 7 are layout views for parts of pixel array units included in image sensors according to some example embodiments, respectively.

FIGS. 1 and 2 illustrate an example, in which one pixel Px includes the two sub areas Pa and Pb, that is, a first sub area Pa and a second sub area Pb, but the number of sub areas Pa Pb included in one pixel Px is not limited thereto. When one pixel Px includes the two sub areas Pa and Pb, the two sub areas Pa and Pb may be arranged while being adjacent to each other in the first direction Dr1.

Each pixel Px including the plurality of sub areas Pa and Pb may generate a first sub pixel signal and a second sub pixel signal corresponding to photocharges accumulated by the plurality of photoelectric conversion elements, respectively, and output the generated first sub pixel signal and second sub pixel signal with a time divisional manner or simultaneously. Each pixel Px may further include a readout element (not illustrated) for processing and outputting the signal generated by the photoelectric conversion of the photoelectric conversion element.

The pixel array unit 300 may further include a micro-lens ML, which corresponds to and overlaps the pixel Px. In the present description, when two constituent elements overlap, an overlapping direction may mean an overlapping in a cross-sectional direction or the third direction Dr3 unless otherwise described. The micro-lens ML may collect light and make the collected light be incident to the pixel Px. The two sub areas Pa and Pb included in one pixel Px correspond to and overlap one micro-lens ML, and an image is focused on each of the two sub areas Pa and Pb through one micro-lens ML.

Referring to FIG. 1, four pixels Px adjacent in a quadrangular shape may form one pixel unit PU, and the plurality of pixel units PU in the pixel array unit 300 may be arranged in a matrix form.

The plurality of pixels Px may transmit the pixel signal SP, which is generated by detecting light, to the second driver 500. Particularly, the plurality of pixels Px may include different pixels Px which detect light of different colors and outputs pixel signals Sp. Contrary to this, one pixel Px may temporarily divide and output or simultaneously output the plurality of pixel signals Sp, which are generated by detecting light of a plurality of colors.

FIGS. 1 and 2 illustrate an example, in which one pixel Px photoelectrically converts light of one color among the plurality of colors and generates a pixel signal. In this case, each pixel Px may include a color filter which selectively allows light of a corresponding specific color to pass. The color filter may be positioned between the micro-lens ML and the photoelectric conversion element in a plane structure.

The color of light, which may be detected by each pixel Px, may be, for example, one among four colors including a first color C1, a second color C2, a third color C3, and a fourth color C4. Each of the first color C1, the second color C2, the third color C3, and the fourth color C4 may be a color in a specific wavelength region. For example, the first color C1, the second color C2, the third color C3, and the fourth color C4 may be blue, white, green, and red, respectively, and an order thereof may be changed. According to some example embodiments, the first color C1, the second color C2, the third color C3, and the fourth color C4 may be yellow, white, magenta, and cyan, respectively, and an order thereof may be changed.

One color or two colors among the first color C1, the second color C2, the third color C3, and the fourth color C4 may also be omitted. In this case, one pixel unit PU may include at least one pair of pixels Px, which are capable of detecting (and/or configured to detect) light of the same color, and a pair of pixels Px for the same color may be adjacent to each other in a diagonal direction in the pixel unit PU. For example, in FIG. 2, the second color C2 and the third color C3 may be the same color, and the same color may be white or green. Further, in FIG. 2, the first color C1 and the fourth color C4 may also be the same color.

In the pixel array unit 300, the pixel unit PU having the same color disposition may also be repeatedly disposed in the first direction Dr1 and the second direction Dr2, and at least two types of pixel units PU having different color dispositions may also be alternately disposed in the first direction Dr1 and/or the second direction Dr2.

When the second color C2 is white, the amount of light, which the photoelectric conversion element of the pixel Px receives, may be increased, so that total sensitivity of the image sensor 1 may be increased. Accordingly, there is room for further decreasing a size of the pixel Px, so that it is possible to increase resolution of the image sensor 1 without the degradation of sensitivity. For example, when a width of one pixel Px is decreased to about 1.22 micrometers, it is possible to maintain sensitivity of the image sensor 1 at low luminance.

At least one pixel Px among the total pixels Px included in the pixel array unit 300 may be an autofocusing pixel PF, which is capable of detecting (and/or configured to detect) a phase difference for controlling autofocusing, and the remaining pixels Px may be normal pixels PN which are not used for the autofocusing control. FIG. 1 illustrates an example, in which two pixels Px adjacent in the diagonal direction in one pixel unit including four pixels Px adjacent in a quadrangular shape are autofocusing pixels PF. That is, the autofocusing pixel PF and the normal pixel PN may be alternately positioned in each row and each column. However, the disposition of the autofocusing pixel PF is not limited to the illustration. In the drawing, the autofocusing pixel PF is indicated with gray hatching, and this is applied to the entire drawings. Signals readout from the autofocusing pixel PF may be referred to as autofocusing pixel signals. Signals readout from the normal pixel PN may be referred to as normal pixel signals.

The autofocusing pixel PF may output the first sub pixel signal and the second sub pixel signal, which are generated as a result of the photoelectric conversion in the two sub areas Pa and Pb, in which one micro-lens ML is positioned, with a time division, and detect a phase difference in the first direction Dr1 by comparing the first and second sub pixel signals. It is possible to measure a distance to an object by using the detected phase difference, and determine whether the object is in focus and the degree by which the object is out of focus.

The normal pixel PN may collect charges, which are generated as a result of the photoelectric conversion in the two sub areas Pa and Pb and output one pixel signal corresponding to the collected charges, thereby decreasing a readout time of the pixel signal Sp.

The colors detectible by the autofocusing pixels PF may be a portion of the plurality of colors detectible by the entire pixels Px. That is, only the pixel signals Sp for some colors among the pixel signals Sp for the light of the different colors output by the pixel array unit 300 may be used for detecting a phase difference for the autofocusing control.

For example, the autofocusing pixels PF may include only the pixel of the second color C2 as illustrated in FIG. 2, or may further include a pixel Px of a different color other than the second color C2.

The kind of color detected by the autofocusing pixel PF may be different according to a color condition, such as a feeling of color and a color temperature, of an object which the image sensor 1 desires to mainly sense. In general, the color detected by the autofocusing pixel PF may be white and/or green, and may further include other colors.

When the autofocusing pixel PF includes the pixel of the second color C2 that is white, it is possible to detect a phase difference and perform the autofocusing function for all colors of the objects, and sensitivity of the autofocusing pixel PF may be increased. Accordingly, it is possible to improve precision of the phase detection for the objects of all of the colors and precision of the autofocusing control. Simultaneously, all of the pixels Px included in the pixel array unit 300 includes the plurality of sub areas Pa and Pb, so that a process condition of forming all of the pixels Px in the manufacturing process of the pixel array unit 300 is uniform. Thus, a manufacturing method is simple. A yield may be increased, and a characteristic deviation between the plurality of pixels Px of the image sensor 1 is reduced and/or minimized to and obtain uniform image data.

According to some example embodiments, even when one pixel Px outputs the pixel signals Sp for the light of the plurality of colors with the time division or during the same time, only the pixel signals Sp for some colors among the pixel signals Sp for the light of the plurality of colors output by the pixel array unit 300 may be used in the phase difference detection for the autofocusing control. Even in this case, some pixels Px among the entire pixels Px included in the pixel array unit 300 may correspond to the autofocusing pixels PF. This will be described in more detail below.

Referring back to FIG. 1, the first driver 400 supplies the driving signal Sr, such as a selection signal, a reset signal, and a transmission signal, to the plurality of pixels Px.

The second driver 500 may receive and process the pixel signal Sp generated by each of the plurality of pixels Px and generate image data. The second driver 500 may include a correlated double sampler (not illustrated), which receives a pixel signal Sp and removes a specific noise for each column, an analog-digital converting (ADC) unit (not illustrated), which is capable of analog-digital converting the signal (and/or configured to analog-digital convert) the signal, in which the noise is removed, or performing a calculation between sub pixel signals, a temporal memory (not illustrated), which stores the digital converted signal, a buffer (not illustrated), which amplifies the digital converted signal and outputs the amplified signal as image data, and the like. The second driver 500 may further include an image data processor (not illustrated), which receives and processes image data. The image data processor may obtain phase difference information about the autofocusing pixel PF, information on a distance to an object and information on a focus from the image sensor 1, and the like.

The timing controller 600 provides a timing signal and a control signal to the first driver 400 and the second driver 500 and controls the operations of the first driver 400 and the second driver 500.

Then, an example structure of the pixel array unit 300 of the image sensor according to some example embodiments will be described with reference to FIGS. 3 to 10 together with FIGS. 1 and 2.

Figure 3:
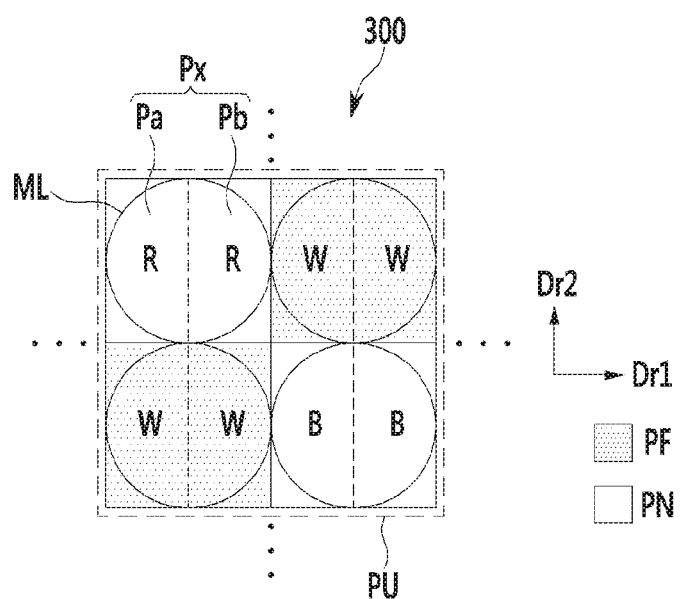

Referring to FIG. 3, one pixel unit PU may include a pair of white pixels W which are adjacent to each other in one diagonal direction, and a blue pixel B and a red pixel R which are adjacent to each other in another diagonal direction. According to some example embodiments, the white pixels W detecting white light among the plurality of pixels Px included in the pixel array unit 300 are the autofocusing pixels PF, and the blue pixel B detecting blue light and the red pixel R detecting red light may be the normal pixels PN. According to some example embodiments, the autofocusing pixel PF includes the white pixel W, so that it is possible to perform the phase difference detection and the autofocusing function on the objects of all of the colors, and sensitivity of the autofocusing pixel PF is relatively high, so that it is possible to increase precision of the phase detection for the objects of all of the colors and precision of the autofocusing control.

According to some example embodiments, positions of the red pixel R and the blue pixel B may also be changed in FIG. 3.

According to some example embodiments, one pixel unit PU may also include a pair of green pixels G instead of the pair of white pixels W in FIG. 3. In this case, the green pixels G may be the autofocusing pixels PF, and the blue pixel B and the red pixel R may be the normal pixels PN.

According to some example embodiments, the kind of color of the light detected by the autofocusing pixel PF may be different depending on a row. For example, in FIG. 3, a row, in which the white pixel W is the autofocusing pixel PF and a row, in which the blue pixel B or the red pixel R is the autofocusing pixel PF, may be alternately arranged in the second direction Dr2. According to this, it is possible to increase precision of the phase difference detection and the autofocusing control by using a pixel of a specific color (e.g., the red pixel R or the blue pixel B), other than the white pixel W, according to a color characteristic of an environment, in which the image sensor 1 is used.

According to some example embodiments, in FIG. 3, one pixel unit PU may also include two pixels selected from a yellow pixel (not illustrated), which is capable of detecting (and/or configured to detect) yellow light, a cyan pixel (not illustrated), which is capable of detecting (and/or configured to detect) cyan light, and a magenta pixel, which is capable of detecting (and/or configured to detect) magenta light, instead of the red pixel R or the blue pixel B.

Figure 4:
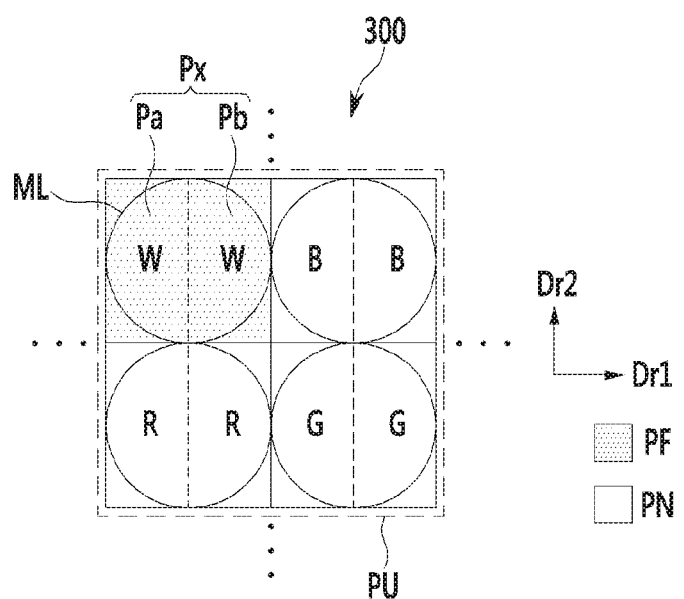

Referring to FIG. 4, one pixel unit PU may include four pixels Px detecting light of different colors, for example, white W, red R, green G, and blue B. In this case, the white pixel W and the green pixel G detecting green light may be adjacent to each other in one diagonal direction. According to some example embodiments, the white pixel W among the plurality of pixels Px included in the pixel array unit 300 may be the autofocusing pixel PF, and the blue pixel B, the green pixel G, and the red pixel R may be the normal pixels PN.

According to some example embodiments, the green pixel G in the exemplary embodiment illustrated in FIG. 4 may be the autofocusing pixel PF. According to this, the autofocusing pixel PF includes the white pixel W, so that it is possible to perform the phase difference detection and the autofocusing function on the objects of all of the colors, and sensitivity of the green pixel G is high, so that it is possible to improve precision of the phase detection and precision and performance of the autofocusing control.

According to some example embodiments, in FIG. 4, one pixel unit PU may also include a yellow pixel, a cyan pixel, and a magenta pixel, instead of the red pixel R, the green pixel G, and the blue pixel B.

The disposition of the pixels Px illustrated in FIGS. 3 and 4 may be applied to the whole pixel array unit 300 or a part of the pixel array unit 300.

Figure 5:
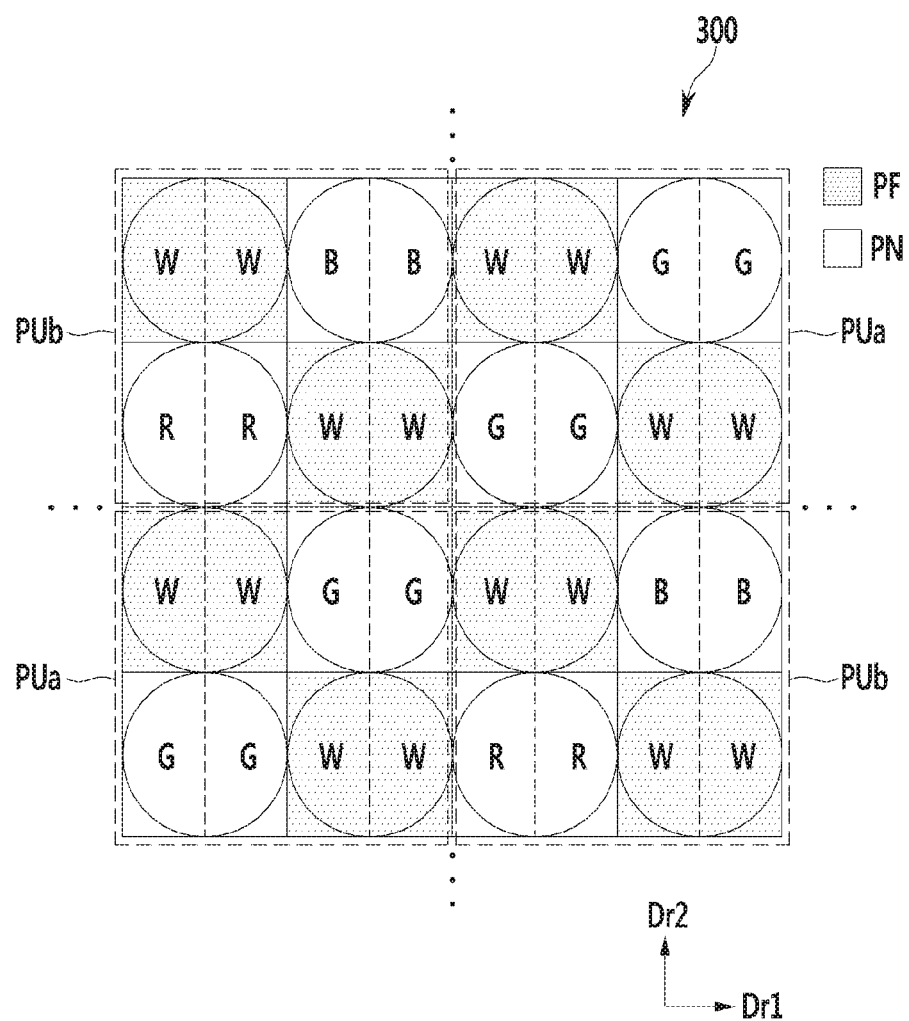
Figure 6:
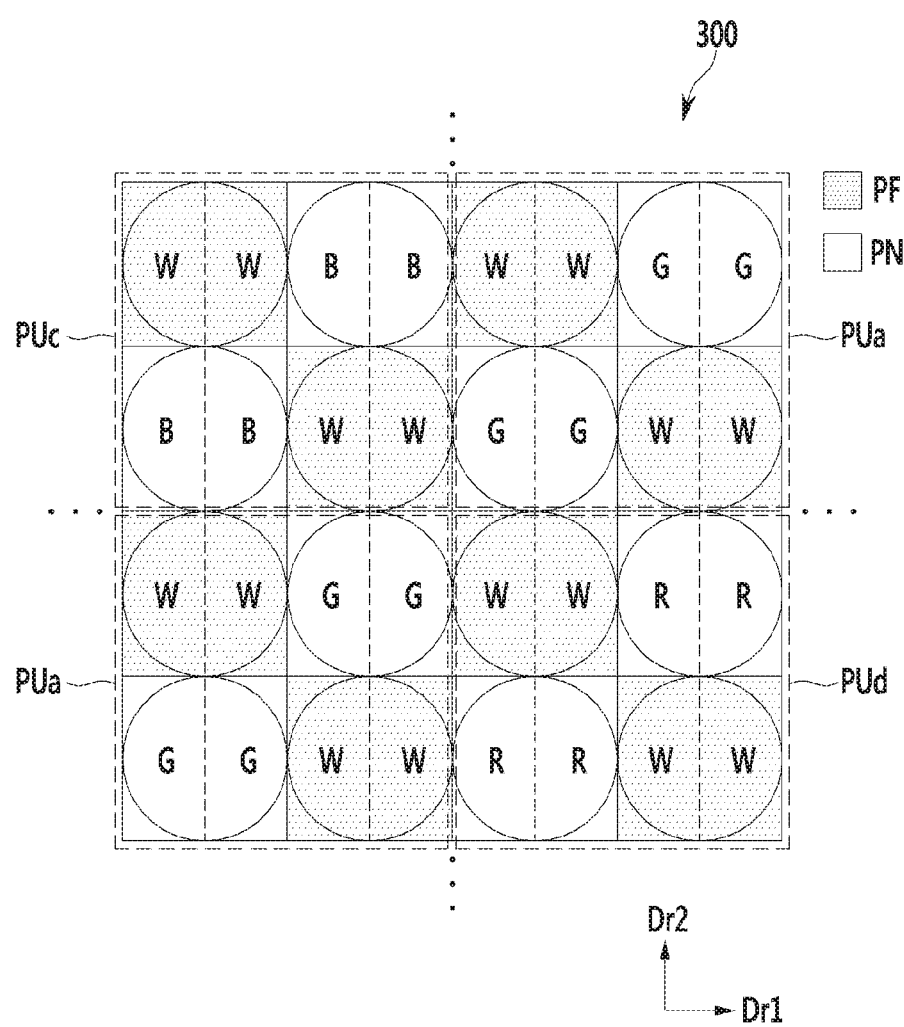
Figure 7:
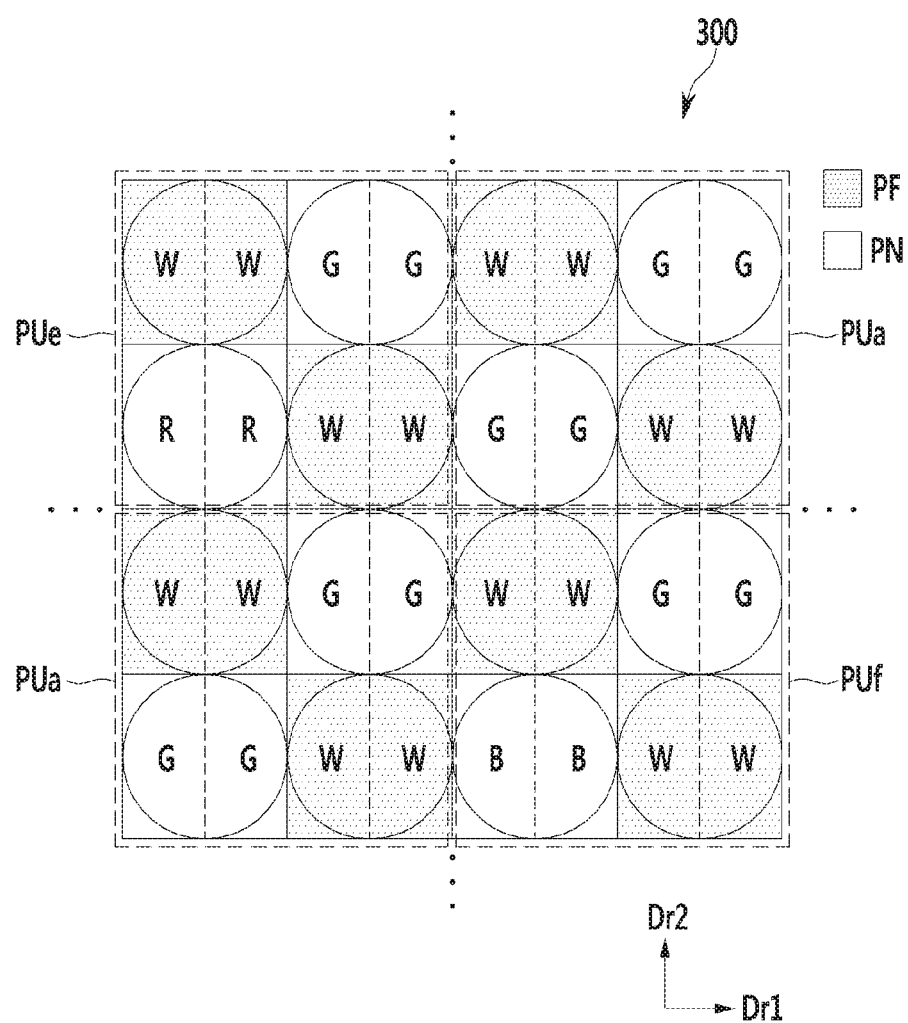

Referring to FIGS. 5 to 7, in the pixel array unit 300, an expanded unit including four pixel units PU adjacent in a quadrangular shape may be repeatedly disposed in the first direction Dr1 and the second direction Dr2. The expanded unit may include 16 pixels Px as illustrated in FIGS. 5 to 7.

Referring to FIG. 5, one expanded unit may include a pair of first pixel units PUa adjacent to each other in one diagonal direction, and a pair of second pixel units PUb adjacent to each other in the other diagonal direction. The first pixel unit PUa may include a pair of white pixels W adjacent to each other in one diagonal direction and a pair of green pixels G adjacent to each other in the other diagonal direction. The second pixel unit PUb may include a pair of white pixels W adjacent to each other in one diagonal direction and a red pixel R and a blue pixel B adjacent to each other in the other diagonal direction.

Referring to FIG. 6, one expanded unit may include a pair of first pixel units PUa adjacent to each other in one diagonal direction, and a third pixel unit PUc and a fourth pixel unit PUd adjacent to each other in the other diagonal direction. The first pixel unit PUa is the same as those described above. The third pixel unit PUc may include a pair of white pixels W adjacent to each other in one diagonal direction and a pair of blue pixels B adjacent to each other in the other diagonal direction. The fourth pixel unit PUd may include a pair of white pixels W adjacent to each other in one diagonal direction and a pair of red pixels R adjacent to each other in the other diagonal direction.

Referring to FIG. 7, one expanded unit may include a pair of first pixel units PUa adjacent to each other in one diagonal direction, and a fifth pixel unit PUe and a sixth pixel unit PUf adjacent to each other in the other diagonal direction. The first pixel unit PUa is the same as those described above. The fifth pixel unit PUe may include a pair of white pixels W adjacent to each other in one diagonal direction and a red pixel R and a green pixel G adjacent to each other in the other diagonal direction. The sixth pixel unit PUf may include a pair of white pixels W adjacent to each other in one diagonal direction and a blue pixel B and a green pixel G adjacent to each other in the other diagonal direction.

In some example embodiments, as illustrated in FIGS. 5 to 7, only some pixels may be the autofocusing pixels PF. For example, only the white pixel W may be the autofocusing pixel PF, or both the white pixels W and the green pixel G may also be the autofocusing pixels PF.

Figure 8:
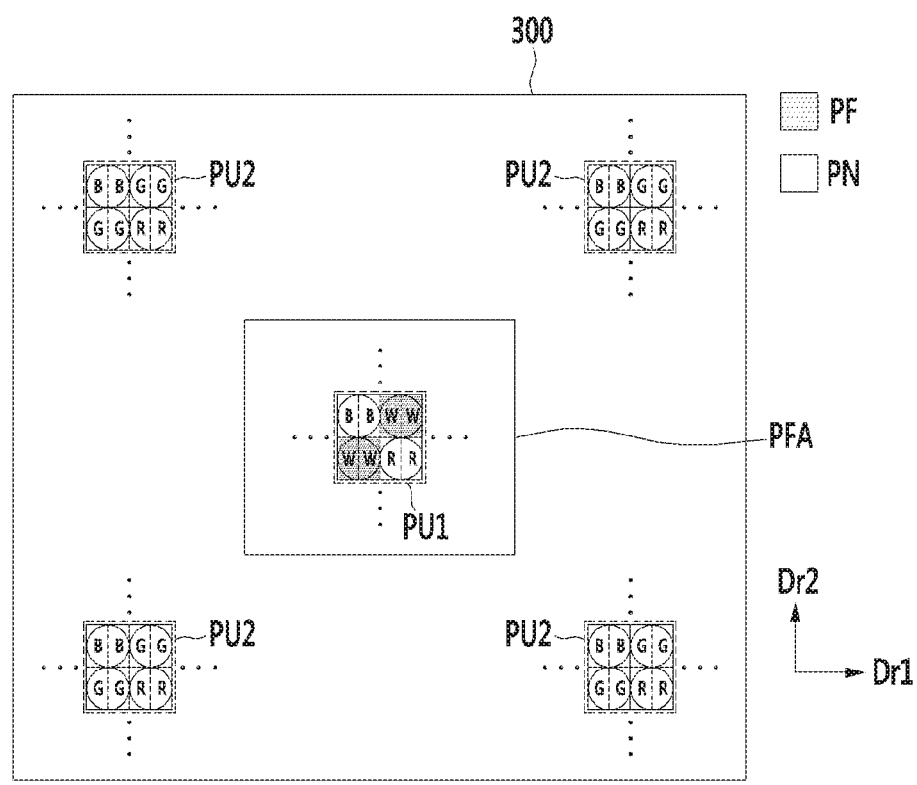
FIGS. 8 to 10 layout views for pixel array units included in image sensors according to some example embodiments, respectively.
Figure 9:
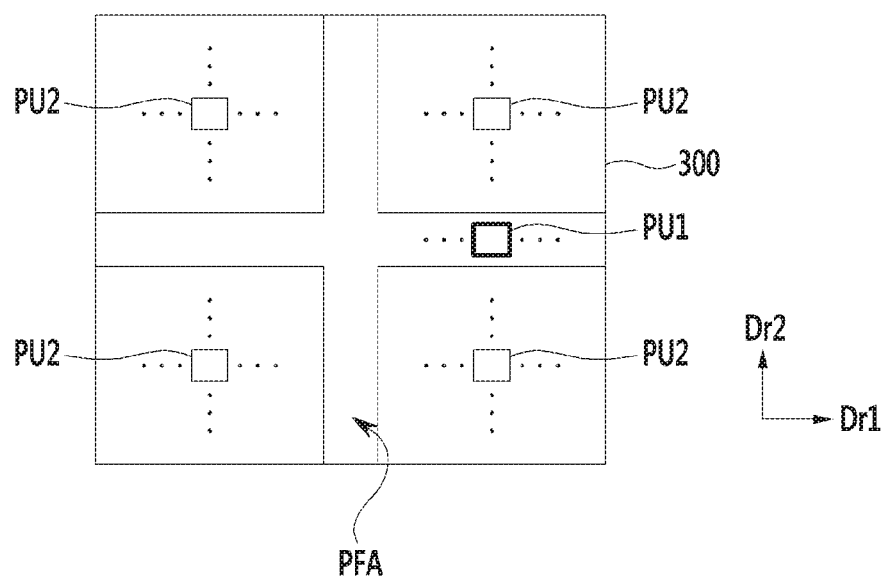

Referring to FIGS. 8 and 9, a pixel unit PU1 including the autofocusing pixel PF may be limited to and positioned in an autofocusing pixel area PFA that is a specific area of the pixel array unit 300. All of the pixel units PU2 positioned in a region other than the autofocusing pixel area PFA may include the normal pixels PN.

The autofocusing pixel area PFA may also be limited to and positioned at a center portion of the pixel array unit 300 as illustrated in FIG. 8, and may also be formed in a cross shape including a horizontal portion and a vertical portion, which cross the pixel array unit 300 in different directions, as illustrated in FIG. 9.

Referring to FIG. 8, the color disposition of the pixels Px positioned in the region, except for the autofocusing pixel area PFA may be different from the color disposition in the autofocusing pixel area PFA. Particularly, referring to FIG. 8, the pixel unit PU1 positioned in the autofocusing pixel area PFA may include a pair of white pixels W adjacent to each other in the diagonal direction, and the pixel unit PU2 positioned in the region, except for the autofocusing pixel area PFA, may include a pair of green pixels G adjacent to each other in the diagonal direction. In the autofocusing pixel area PFA, the white pixel W may be the autofocusing pixel PF.

As illustrated in FIG. 8, when an image is detected by using the white pixel W as the autofocusing pixel PF in the autofocusing pixel area PFA, and disposing the large number of green pixels G in the remaining region, except for the autofocusing pixel area PFA, it is possible to increase precision of the phase detection and the autofocusing control based on high sensitivity of the white pixel W in the autofocusing pixel area PFA, and simultaneously improve a feeling of color of detected image data because the pixels Px of the entire colors including the green pixel G are used in the region except for the autofocusing pixel area PFA.

According to some example embodiments, the color disposition of the pixels Px of the pixel unit PU2 positioned in the region except for the autofocusing pixel area PFA may also be the same as the color disposition of the pixel unit PU1 in the autofocusing pixel area PFA.

Figure 10:
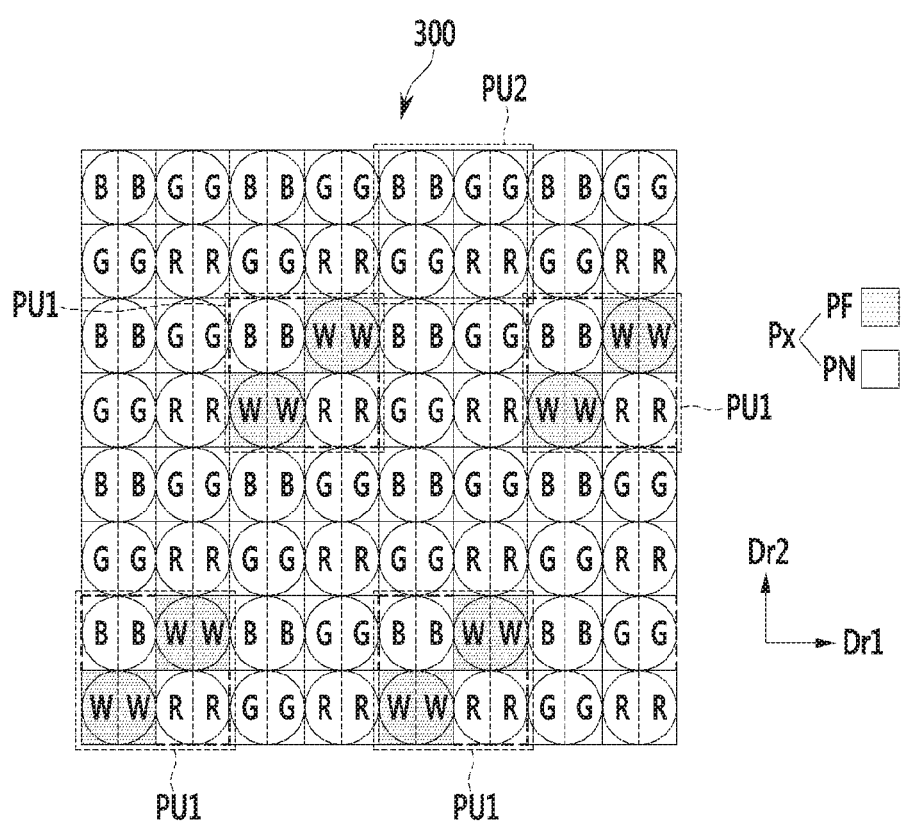

Referring to FIG. 10, the pixel units PU1 including the autofocusing pixels PF in the pixel array unit 300 may be distributed while being spaced apart from each other. In this case, the pixel unit PU2 other than the pixel unit PU1 may have a different color disposition from that of the pixel unit PU1 including the autofocusing pixel PF as illustrated in FIG. 10. For example, the pixel unit PU1 including the autofocusing pixel PF may include a pair of white pixels W adjacent to each other in the diagonal direction, and the pixel unit PU2 including only the normal pixels PN may include a pair of green pixels G adjacent to each other in the diagonal direction, instead of the white pixels W. In the pixel unit PU1, the white pixel W may be the autofocusing pixel PF.

Unlike FIG. 10, the color disposition of the pixel unit PU1 including the autofocusing pixel PF may also be the same as the color disposition of the pixel unit PU2 including only the normal pixel PN.

An example structure of the pixel array unit 300 and a structure of the pixel Px according to some example embodiments will be described with reference to FIGS. 11 and 12 together with the aforementioned drawings.

Figure 11:
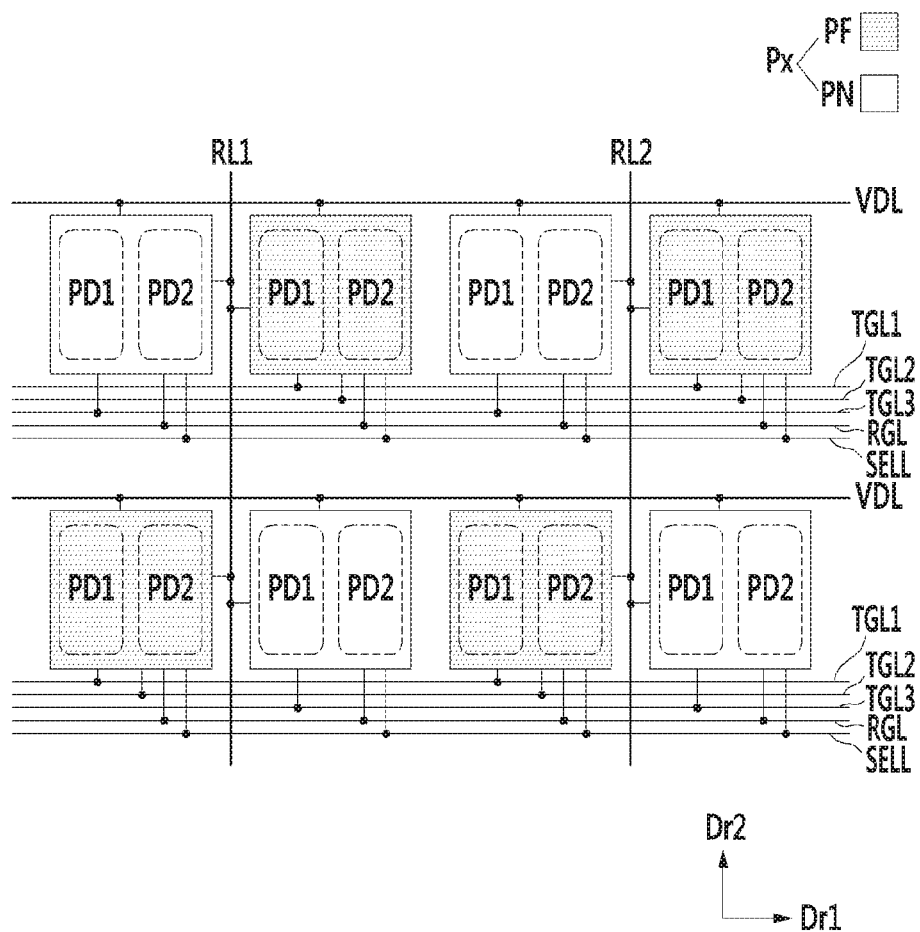
FIG. 11 is a diagram illustrating a connection relation of a plurality of pixels and a plurality of signal lines included in the image sensor according to some example embodiments.

Referring to FIG. 11, each pixel Px includes a plurality of first and second photoelectric conversion elements PD1 and PD2 each of which is capable of independently photoelectrically converting light (and/or configured to independently convert light).

A plurality of signal lines included in the pixel array unit 300 may include a power voltage line VDL, a plurality of transmission signal lines TGL1, TGL2, and TGL3, a reset signal line RGL, and a selection signal line SELL that are disposed every at least one row, and output signal lines RL1 and RL2 disposed by every at least one column. FIG. 11 illustrates an example, in which the power voltage line VDL, the plurality of transmission signal lines TGL1, TGL2, and TGL3, the reset signal line RGL, and the selection signal line SELL are disposed for each row, and the output signal lines RL1 or RL2 are disposed by every two columns, so that two pixels Px adjacent to each other in the first direction Dr1 share one output signal line RL1 or RL2. The two adjacent pixels Px sharing one output signal line RL1 or RL2 may be connected to the different transmission signal lines TGL1, TGL2, and TGL3.

The power voltage line VDL, the transmission signal lines TGL1, TGL2, and TGL3, the reset signal line RGL, and the selection signal line SELL may be generally extended in the first direction Dr1, and the output signal lines RL1 and RL2 may be extended in a direction (e.g., the second direction Dr2) crossing the first direction Dr1.

The power voltage line VDL may transmit a uniform power voltage VDD, and the plurality of transmission signal lines TGL1, TGL2, and TGL3 disposed in one row may independently transmit transmission signals TG1, TG2, and TG3 and transmit the charges generated in the photoelectric conversion elements PD1 and PD2 of the pixel Px to a readout element (not illustrated). The reset signal line RGL may transmit a reset signal RG for resetting the pixel Px, and the selection signal line SELL may transmit a selection signal SEL for directing a row selection. The transmission signals TG1, TG2, and TG3, the reset signal RG, and the selection signal SEL may be output from the aforementioned first driver 400. The first driver 400 may sequentially or non-sequentially output the transmission signals TG1, TG2, and TG3, the reset signal RG, and the selection signal SEL for each row.

The number of transmission signal lines TGL1, TGL2, and TGL3 connected with the autofocusing pixel PF may be different from the number of transmission signal lines TGL1, TGL2, and TGL3 connected with the normal pixel PN. Particularly, the number of transmission signal lines TGL1, TGL2, and TGL3 connected with one normal pixel PN may be smaller than the number of transmission signal lines TGL1, TGL2, and TGL3 connected with one autofocusing pixel PF or may be generally one. The number of transmission signal lines TGL1, TGL2, and TGL3 connected with one autofocusing pixel PF may be changed according to the number of photoelectric conversion elements included in one pixel Px. Although FIG. 1 illustrates an example, in which one pixel Px includes two photoelectric conversion elements PD1 and PD2, inventive concepts are not limited thereto. In some example embodiments, a pixel may include more than two photoelectric conversion elements.

Referring to FIG. 11, one autofocusing pixel PF may be connected to the two transmission signal lines TGL1 and TGL2, and the normal pixel PN may be connected to one transmission signal line TGL3. The transmission signal line TGL3 connected with the normal pixel PN may be a different transmission signal line from the transmission signal lines TGL1 and TGL2 connected with the autofocusing pixel PF positioned in the same row. Particularly, between the autofocusing pixel PF and the normal pixel PN positioned in one row and connected to the same output signal line RL1 or RL2, the autofocusing pixel PF may be connected to the first and second transmission signal lines TGL1 and TGL2, and the normal pixel PN may be connected to the third transmission signal line TGL3.

Although not illustrated, when there exists a row including only the normal pixel PN, one of the two adjacent normal pixels PN connected to the same output signal line RL1 or RL2 may be connected to one of the first to third transmission signal lines TGL1, TGL2, and TGL3, and the other may be connected to one of the remaining transmission signal lines TGL1, TGL2, and TGL3. A connection relation between the pixel Px and the signal line may be variously changed.

The pixels Px positioned in the same row may be connected to the same reset signal line RGL and the same selection signal line SELL.

An example of a circuit structure of one pixel Px will be described with reference to FIG. 12.

Figure 12:
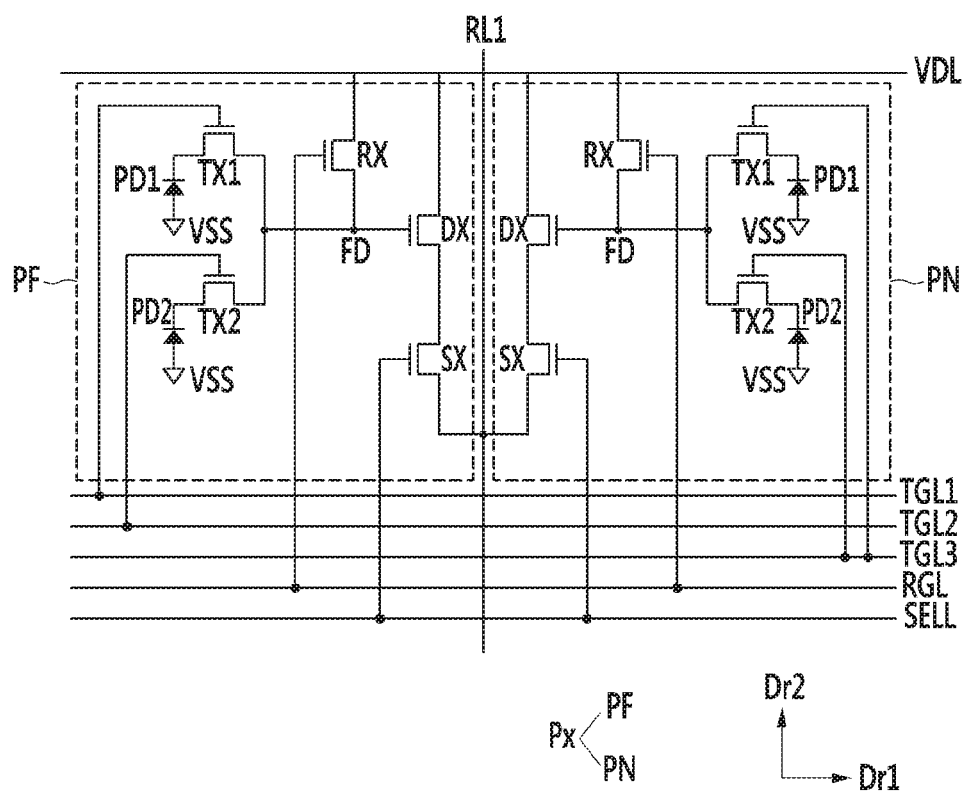
FIG. 12 is an equivalent circuit diagram of two pixels included in the image sensor according to some example embodiments.

In FIG. 12, one pixel Px includes the first and second photoelectric conversion elements PD1 and PD2, and a readout element for reading out photoelectric conversion signals of the first and second photoelectric conversion elements PD1 and PD2. The readout element may include first and second transmission transistors TX1 and TX2 connected between a floating diffusion node FD and the first and second photoelectric conversion elements PD1 and PD2, a reset transistor RX and a driving transistor DX connected between the floating diffusion node FD and the power voltage line VDL, and a selection transistor SX connected between the driving transistor DX and the output signal line RL1.

Each of the first and second photoelectric conversion elements PD1 and PD2 may be a photodiode including an anode connected to a common voltage VSS. A cathode of the photodiode is connected to the first and second transmission transistors TX1 and TX2. Charges generated through the reception of light by the first and second photoelectric conversion elements PD1 and PD2 may be transmitted to the floating diffusion node FD through the first and second transmission transistors TX1 and TX2.

Gates of the first and second transmission transistors TX1 and TX2 may be connected to the transmission signal lines TGL1, TGL2, and TGL3 and receive the transmission signals TG1, TG2, and TG3. As described above, the gates of the first and second transmission transistors TX1 and Tx2 of the autofocusing pixel PF may be connected to the different transmission signal lines TGL1 and TGL2, and the gates of the first and second transmission transistors TX1 and TX2 of the normal pixel PN may be connected to the same transmission signal line TGL3. Accordingly, the charges generated by each of the first and second photoelectric conversion elements PD1 and PD2 of the autofocusing pixel PF may be transmitted to the floating diffusion node FD through the first and second transmission transistors TX1 and TX2, which are turned on at different times, and the charges generated by each of the first and second photoelectric conversion elements PD1 and PD2 of the normal pixel PN may be transmitted to the floating diffusion node FD through the first and second transmission transistors TX1 and TX2, which are turned on at the same time.

The floating diffusion node FD accumulates and stores the received charges, and the driving transistor DX may be controlled according to the quantity of charges accumulated in the floating diffusion node FD.

A gate of the reset transistor RX is connected with the reset signal line RGL. The reset transistor RX may be controlled by the reset signal RG transmitted by the reset signal line RGL and periodically reset the floating diffusion node FD with the power voltage VDD.

The driving transistor DX may output a voltage which is varied in response to a voltage of the floating diffusion node FD. The driving transistor DX may be combined with a constant current source (not illustrated) to serve as a source follower buffer amplifier. The driving transistor DX may generate a source-drain current in proportion to a size of the quantity of charges applied to the gate.

A gate of the selection transistor SX is connected with the selection signal line SELL. The selection transistor SX, which is turned on according to an activation of the selection signal SEL transmitted by the selection signal line SELL, may output a current generated in the driving transistor DX to the output signal line RL1 as a pixel signal Sp. The selection signal SEL is a signal selecting a row, which is to output the pixel signal Sp, and may be sequentially or non-sequentially applied in a unit of the row.

Unlike the illustration of FIG. 12, each of the first and second transmission transistors TX1 and TX2 in one pixel Px may be connected to a separate floating diffusion node (not illustrated), without being connected to the same floating diffusion node FD.

Then, a method of driving the image sensor according to some example embodiments during one frame will be described with reference to FIGS. 13 and 14 together with aforementioned FIG. 12.

First, when an activated selection signal SEL having a gate-on voltage level is applied to the selection signal line SELL, a selection transistor SX positioned in a selected row is turned on. When an activated reset signal RG is applied to the reset signal line RGL in the turn-on state of the selection transistor SX, the reset transistor RX positioned in the corresponding row is turned on, the charges of the floating diffusion node FD are discharged, and the floating diffusion node FD is reset, and a reset output signal corresponding to charges of the reset floating diffusion node FD is output to the output signal line RL1 through the driving transistor DX and the selection transistor SX.

Next, when the reset transistor RX is turned off and an activated transmission signal TG1 is applied to the first transmission signal line TGL1 at a first timing t1, the first transmission transistor TX1 of the autofocusing pixel PF is turned on and photoelectrically converted charges of the first photoelectric conversion element PD1 are transmitted to the floating diffusion node FD. Then, a first sub pixel signal corresponding to the photoelectrically converted signal of the first sub area Pa of the autofocusing pixel PF is output to the output signal line RL1 through the driving transistor DX and the turned-on selection transistor SX.

Then, when an activated transmission signal TG2 is applied to the second transmission signal line TGL2 at a second timing t2 after the first timing t1, the second transmission transistor TX2 of the autofocusing pixel PF is turned on and photoelectrically converted charges of the second photoelectric conversion element PD2 are transmitted to the floating diffusion node FD. Then, a first sub pixel signal corresponding to the photoelectrically converted signal of the first sub area Pb of the autofocusing pixel PF is output to the output signal line RL1 through the driving transistor DX and the turned-on selection transistor SX.

Figure 13:
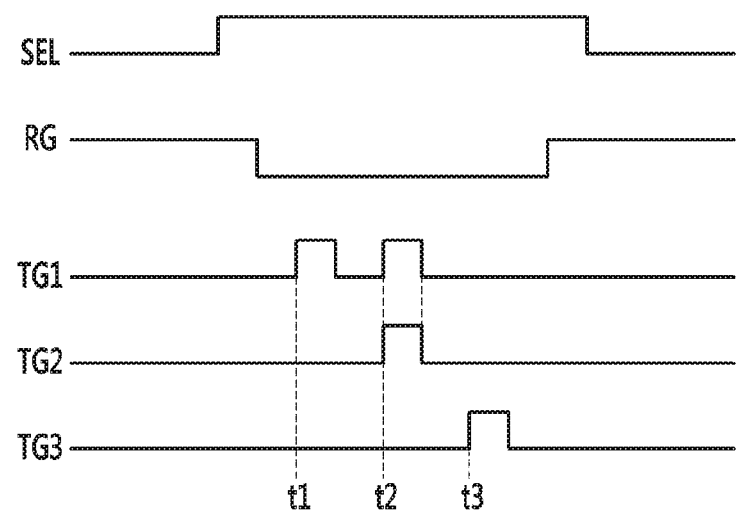
FIGS. 13 and 14 are timing diagrams of a driving signal applied to one row of a pixel array unit included in the image sensor according to some example embodiments, respectively.

In this case, as illustrated in FIG. 13, the activated transmission signal TG1 having the gate-on voltage level is also transmitted to the first transmission signal line TGL1 at the second timing t2, at which the activated transmission signal TG2 having the gate-on voltage level is transmitted to the second transmission signal line TGL2, so that the first and second transmission transistors TX1 and TX2 of the autofocusing pixel PF may be simultaneously turned on. That is, the transmission signal TG1 applied to one row during one frame may be activated two times, and the transmission signal TG2 may be activated one time. Then, the photoelectrically converted charges of the first and second photoelectric conversion elements PD1 and PD2 of the autofocusing pixel PF may be transmitted to the floating diffusion node FD together, and a pixel signal corresponding to a sum of the first and second sub pixel signals may be output to the output signal line RL1.

Figure 14:
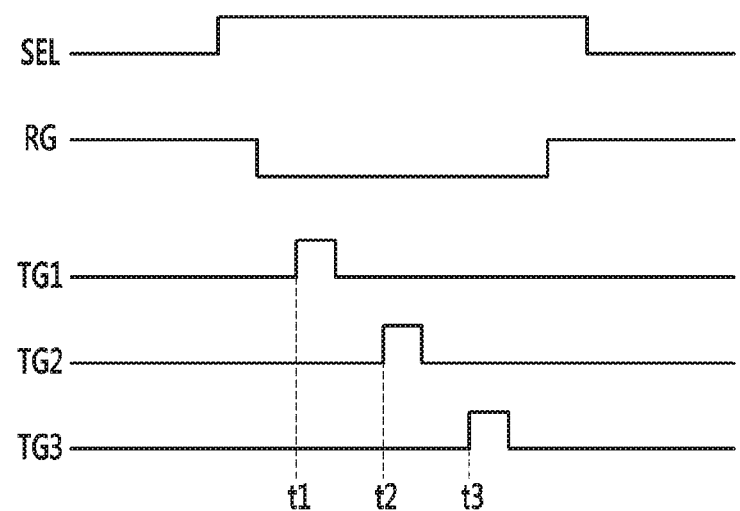

Alternatively, as illustrated in FIG. 14, when the activated transmission signal TG2 is transmitted to the second transmission signal line TGL2 at the second timing t2, the first transmission signal line TGL1 may be inactivated and only the second transmission transistor TX2 of the autofocusing pixel PF may be turned on, the photoelectrically converted charges of the second photoelectric conversion element PD2 may be transmitted to the floating diffusion node FD, and only the second sub pixel signal may be output to the output signal line RL1.

Then, when an activated transmission signal TG3 having a gate-on voltage level is transmitted to the third transmission signal line TGL3 at a third timing t3 in the turn-off state of the first and second transmission transistors TX1 and TX2 of the autofocusing pixel PF, the first and second transmission transistors TX1 and TX2 of the normal pixel PN are simultaneously turned on and the photoelectrically converted charges of the first and second photoelectric conversion elements PD1 and PD2 of the normal pixel PN are transmitted to the floating diffusion node FD together. Then, a pixel signal according to the quantity of charges accumulated in the floating diffusion node FD is output to the output signal line RL1 through the driving transistor DX and the turned-on selection transistor SX.

The second driver 500 may remove a noise from the pixel signal or the first and second sub pixel signals through a subtraction between the reset output signal and the pixel signal or the first and second sub pixel signals. Further, in a case of the driving method according to some example embodiments illustrated in FIG. 13, the second driver 500 may obtain the second sub pixel signal through a subtraction of the first sub pixel signal from the sum of the first and second sub pixel signals output at different times from the autofocusing pixel PF. It is possible to obtain image data of the corresponding autofocusing pixel PF by using the sum of the first and second sub pixel signals obtained for the autofocusing pixel PF, and obtain image data of the corresponding normal pixel PN by using the pixel signal obtained for the normal pixel PN.

It is possible to detect a phase difference between light incident to the first and second sub areas Pa and Pb of the autofocusing pixel PF by using the obtained first and second sub pixel signals. It is possible to obtain focus information, such as a distance to an object, whether the object is in focus, and the degree by which the object is out of focus, by using the detected phase difference. Further, the first and second transmission transistors TX1 and TX2 are simultaneously driven by using one transmission signal TG3 and one pixel signal is read out for the normal pixel PN, so that an entire readout rate of the image sensor 1 may be increased. That is, according to some example embodiments, for the normal pixel PN including the plurality of sub areas Pa and Pb, a readout time may be decreased to about ¾, compared to a case where the plurality of different transmission signals is transmitted like the autofocusing pixel PF.

Next, another example of the pixel array unit 300 and a structure of the pixel PX according to some example embodiments will be described with reference to FIGS. 15 and 16 together with the aforementioned drawings. Descriptions of the same constituent elements as those described above will be omitted.

Figure 15:
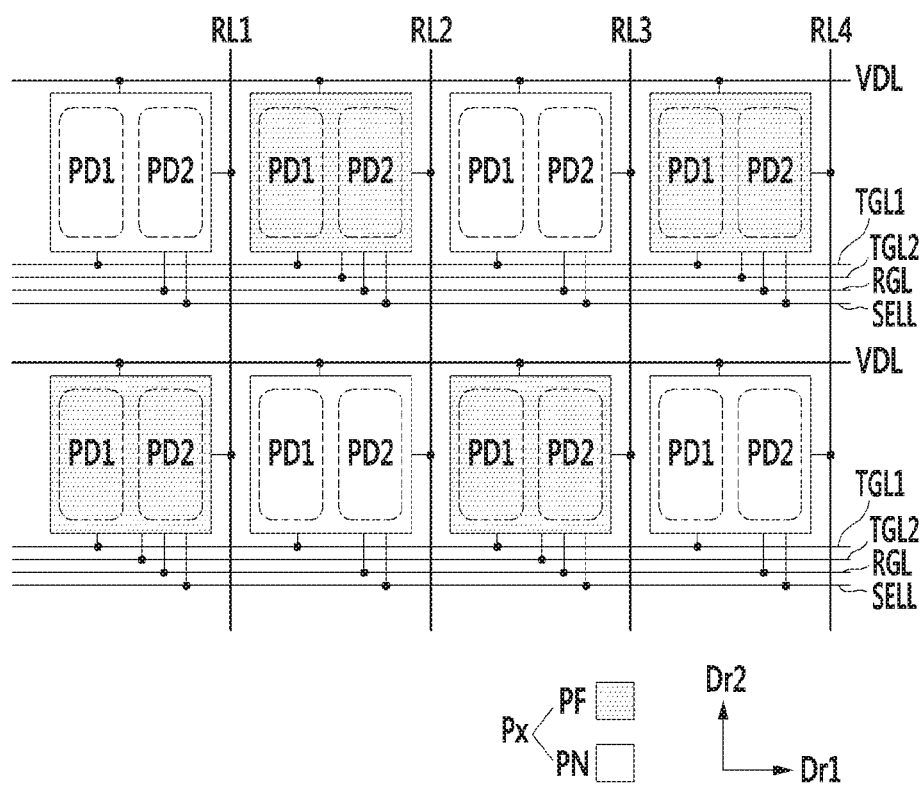
FIG. 15 is a diagram illustrating a connection relation between a plurality of pixels and a plurality of signal lines included in the image sensor according to some example embodiments.

Referring to FIG. 15, the structure of the pixel array unit 300 according to some example embodiments is mostly the same as the pixel array unit 300 in FIG. 11, but the first and second transmission signal lines TGL1 and TGL2 may be disposed for each row, and the output signal lines RL1, RL2, RL3, or RL4 may be disposed for every column, so that the two pixels Px adjacent to each other in the first direction Dr1 may be connected to the different output signal lines RL1, RL2, RL3, and RL4.

The autofocusing pixel PF is connected to the two transmission signal lines TGL1 and TGL2, so that the first and second photoelectric conversion elements PD1 and PD2 included in the autofocusing pixel PF may transmit photoelectrically converted charges to the floating diffusion node FD at different timings. Unlike, the normal pixel PN may be connected to one transmission signal line TGL1 or TGL2. Accordingly, the first and second photoelectric conversion elements PD1 and PD2 included in the normal pixel PN may transmit photoelectrically converted charges to the floating diffusion node FD at the same timing. The transmission signal lines TGL1 connected with the normal pixel PN may be the same as one of the transmission signal lines TGL1 and TGL2 connected with the autofocusing pixel PF positioned in the same row. FIG. 15 illustrates an example, in which the normal pixel PN is connected to the first transmission signal line TGL1, but the normal pixel PN is not limited thereto, and may also be connected to the second transmission signal line TGL2.

Although not illustrated, when one row includes only the normal pixel PN, all of the normal pixels PN positioned in the row may be connected to one of the two transmission signal lines TGL1 and TGL2.

Figure 16:
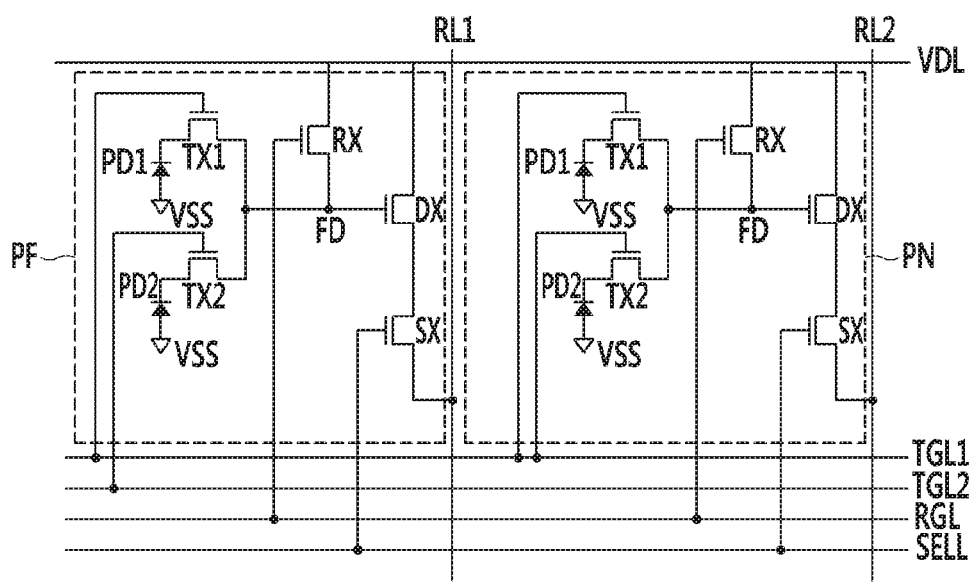
FIG. 16 is an equivalent circuit diagram of two pixels included in the image sensor according to some example embodiments.
Figure 16:

FIG. 16 illustrates a circuit structure of one pixel Px according to some example embodiments illustrated in FIG. 15, and the circuit structure of each pixel Px is the same as that illustrated in FIG. 12, so that a detailed description thereof will be omitted.

Next, an example structure of an image sensor according to some example embodiments will be described with reference to FIGS. 17 and 18 together with the aforementioned drawings. Descriptions of the same constituent elements as those described above will be omitted.

Figure 17:
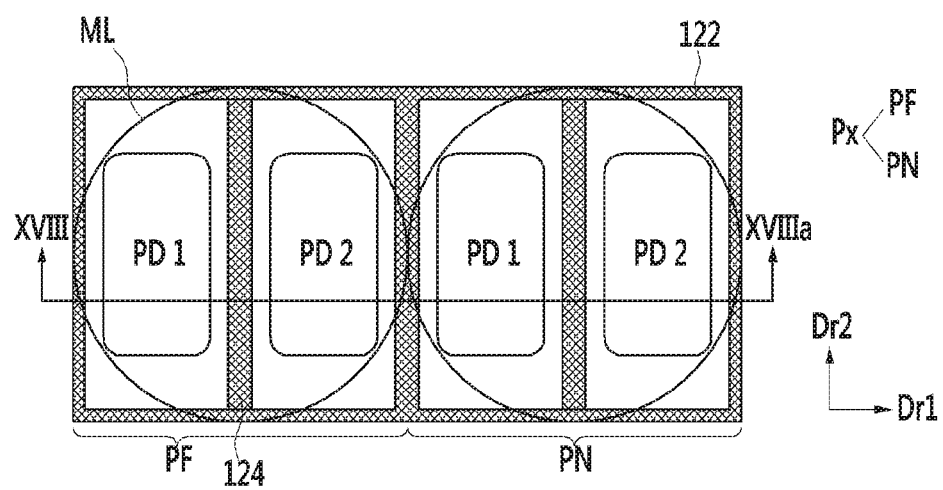
FIG. 17 is a schematic top plan view of two pixels included in the image sensor according to some example embodiments.
Figure 18:
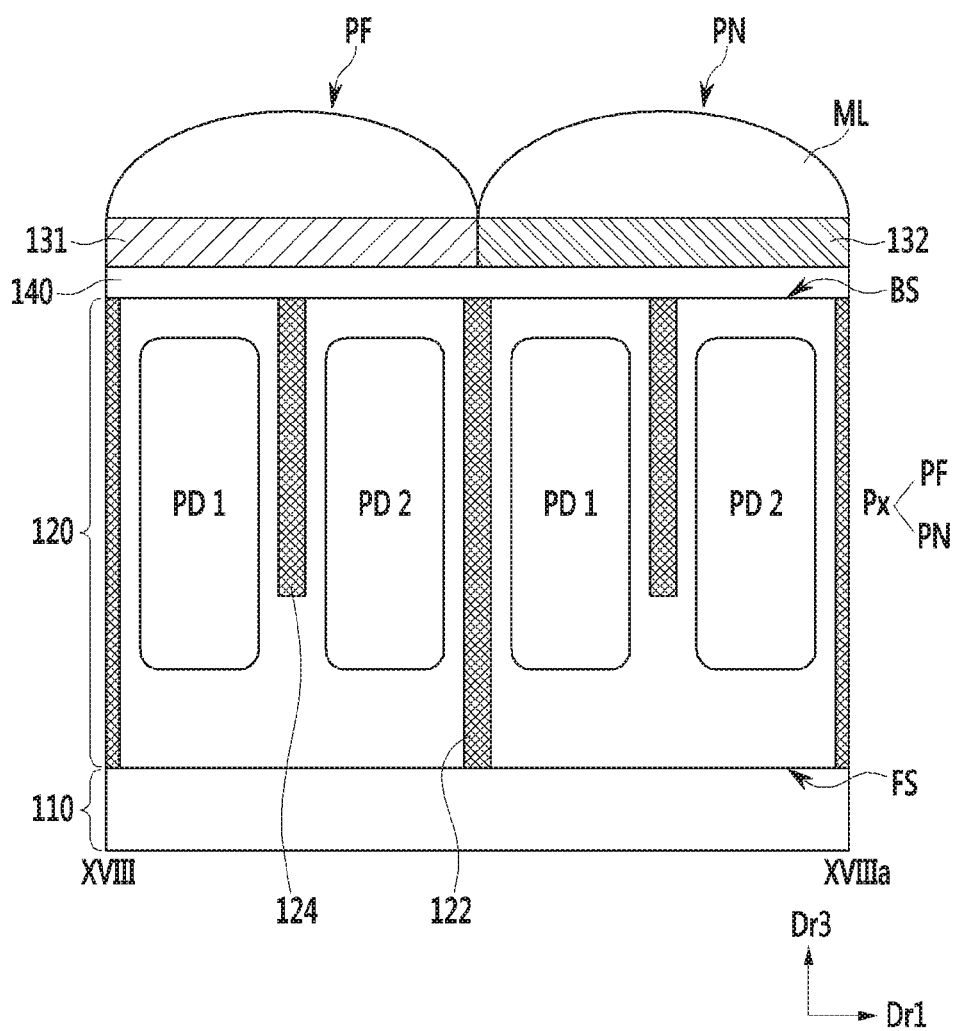
FIG. 18 is a cross-sectional view illustrating the image sensor illustrated in FIG. 17 taken along line XVIII-XVIIIa.

Referring to FIGS. 17 and 18, the image sensor according to some example embodiments may include a semiconductor substrate 120 having a first surface BS and a second surface FS facing each other. The semiconductor substrate 120 may be a substrate including, for example, silicon, germanium, silicon-germanium, a Group VI compound semiconductor, and a Group V compound semiconductor. The semiconductor substrate 120 may be a silicon substrate, into which P-type or N-type impurities are injected. Here, an example will be described based on the semiconductor substrate 120, into which P-type impurities are injected, as an example.

Here, the semiconductor substrate 120 may include a plurality of photoelectric conversion elements PD1 and PD2, a floating diffusion node (not illustrated) region, and the like positioned in each pixel Px. The floating diffusion node region may be formed of, for example, a region, in N-type impurities are doped.

Each of the photoelectric conversion elements PD1 and PD2 may be configured by a PN junction, and a pair of electron and hole may be generated according to incident light to generate photocharges. The photoelectric conversion elements PD1 and PD2 may be formed by ion-injecting impurities, for example, N-type impurities, having an opposite conduction type to that of the semiconductor substrate 120, into the semiconductor substrate 120. The photoelectric conversion elements PD1 and PD2 may also be formed in a form, in which a plurality of doping regions may be laminated.

The semiconductor substrate 120 may include a first isolator 122, which may be positioned between the adjacent pixels Px, particularly, between an autofocusing pixel PF and a normal pixel PN to divide the adjacent pixels Px. The first isolator 122 may surround each pixel Px on a plane as illustrated in FIG. 17.

The first isolator 122 may be deeply formed in a third direction Dr3 in a cross-section structure as illustrated in FIG. 18. For example, the first isolator 122 may also pass through the semiconductor substrate 120 in the third direction Dr3, and may be positioned within the semiconductor substrate 120 while an upper surface of the first isolator 122 meets a first surface BS of the semiconductor substrate 120 and a lower surface of the first isolator 122 does not meet a second surface FS of the semiconductor substrate 120.

The semiconductor substrate 120 may further include a second isolator 124, which may be positioned between the first and second photoelectric conversion elements PD1 and PD2 adjacent to each other within one pixel Px and divides the first and second photoelectric conversion elements PD1 and PD2. The second isolator 124 may be approximately extended in the second direction Dr2 in a plane structure, but is not limited thereto. The second isolator 124 may also be connected to the first isolator 122 on a plane as illustrated in FIG. 17, and may also be spaced apart from the first isolator 122.

Referring to FIG. 18, a depth of the second isolator 124 in the third direction Dr3 may be smaller than or equal to a depth of the first isolator 122 in the third direction Dr3. As illustrated in FIG. 18, an upper surface of the second isolator 124 may meet the first surface BS of the semiconductor substrate 120, and a lower surface thereof may be positioned within the semiconductor substrate 120.

At least one of the first isolator 122 and the second isolator 124 may include an insulating material, such as oxide, nitride and polysilicon, or a combination thereof. In this case, at least one of the first isolator 122 and the second isolator 124 may be formed by forming a trench by patterning the semiconductor substrate 120 at the first surface BS side or the second surface FS side and then burying the insulating material in the trench.

According to some example embodiments, at least one of the first isolator 122 and the second isolator 124 may also be formed by ion-injecting impurities, for example, P-type impurities, having an opposite conductive type to that of the first and second photoelectric conversion elements PD1 and PD2, into the semiconductor substrate 120. In this case, a concentration of impurities of at least one of the first isolator 122 and the second isolator 124 may be higher than a concentration of impurities of the semiconductor substrate 120 around at least one of the first isolator 122 and the second isolator 124.

According to some example embodiments, the first isolator 122 may include an insulating material, such as an oxide, a nitride, and polysilicon, and the second isolator 124 may be doped with impurities. Particularly, the second isolator 124 may be doped with the impurities having the same conductive type as the impurities of the semiconductor substrate 120 around the second isolator 124 with a higher concentration.

The first isolator 122 may limit and/or prevent an electric crosstalk between the adjacent pixels Px by limiting and/or blocking a movement of the charges between the adjacent pixels Px, and may also limit and/or prevent an optical crosstalk which may occur due to the pass of light through the adjacent pixel Px by refracting light slantly (and/or diagonally) incident to one pixel Px. The second isolator 124 may limit and/or prevent an electric crosstalk between the adjacent photoelectric conversion elements PD1 and PD2 by limiting and/or blocking a movement of the charges between the adjacent photoelectric conversion elements PD1 and PD2, and may also limit and/or prevent an optical crosstalk which may occur due to the pass of light through the different photoelectric conversion element PD1 or PD2 within the same pixel Px by refracting light slantly (and/or diagonally) incident to one photoelectric conversion element PD1 or PD2. Particularly, the second isolator 124 positioned in the autofocusing pixel PF may limit and/or prevent an electrical and optical crosstalk between the first and second photoelectric conversion elements PD1 and PD2, thereby increasing precision of the phase difference detection and precision of the autofocusing control.

At least one of the first isolator 122 and the second isolator 124 may also be omitted according to a design condition of the image sensor.

A plurality of color filters 131 and 132 and a micro-lens ML may be positioned on the first surface BS of the semiconductor substrate 120. One color filter 131 or 132 and one micro-lens ML may be positioned so as to correspond to each pixel to overlap both the first photoelectric conversion element PD1 and the second photoelectric conversion element PD2 included in one pixel Px in the third direction Dr3.

The color filters 131 and 132 positioned in the adjacent pixels Px, respectively, may select light of different colors and allow the light to pass through. Each of the color filters 131 and 132 may selectively allow light of blue, green, and red to pass through, or selectively allow light of magenta, yellow, cyan, and the like to pass through, or allow light of white to pass through. The white color filters 131 and 132 may be transparent and allow light of all of the color wavelengths to pass through. The color filters 131 and 132 may also be omitted.

A wiring layer 110 may be positioned on the second surface FS of the semiconductor substrate 120. The wiring layer 110 may include a plurality of transistors included in the pixel Px and several wires connected to the plurality of transistors. Unlike the illustration in FIG. 18, the wiring layer 110 may also be (or may alternatively) positioned between the semiconductor substrate 120 and the color filters 131 and 132.

An insulating layer 140 may be further positioned between the first surface BS of the semiconductor substrate 120 and the color filters 131 and 132. The insulating layer 140 may limit and/or prevent incident light from being reflected and efficiently allow the incident light to pass through, thereby improving performance of the image sensor.

According to some example embodiments, the wiring layer 110 may also be (or may alternatively) positioned between the color filters 131 and 132 and the semiconductor substrate 120.

Next, an example structure of an image sensor according to some example embodiments will be described with reference to FIG. 19 together with the aforementioned drawings. The same descriptions of the same constituent elements as those described above will be omitted.

Figure 19:
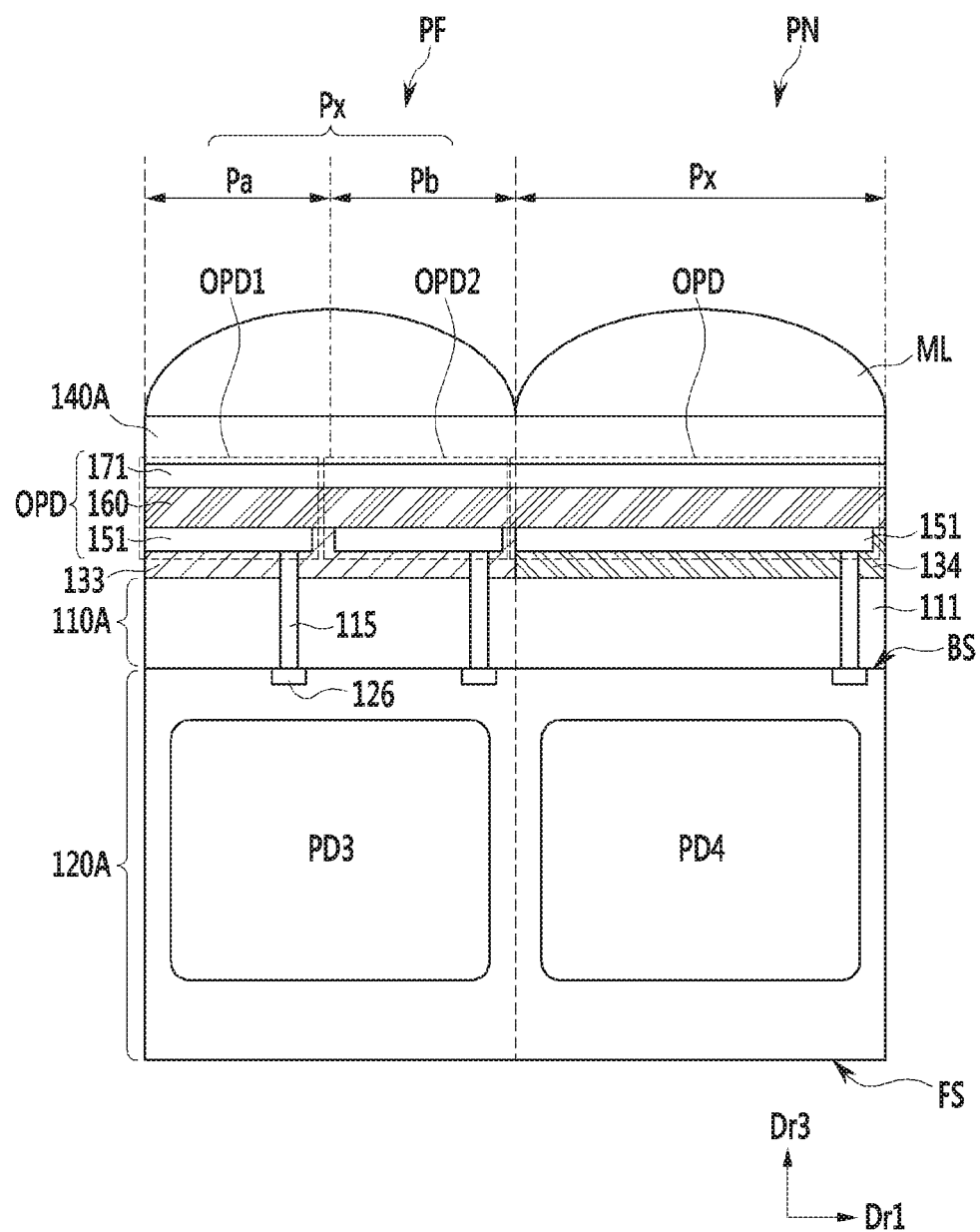
FIG. 19 is a cross-sectional view of two pixels included in the image sensor according to some example embodiments.

One pixel Px of the image sensor according to some example embodiments illustrated in FIG. 19 may include a plurality of photoelectric conversion elements laminated in the third direction Dr3. For example, one pixel Px may include an organic photoelectric conversion element OPD and photoelectric conversion elements PD3 and PD4 formed on a semiconductor substrate 120A.

The organic photoelectric conversion element OPD may be positioned on a first surface BS of the semiconductor substrate 120A. One organic photoelectric conversion element OPD may include an organic photoelectric conversion layer 160, which is selectively detecting light of a specific color wavelength region, and one first electrode 151 and one second electrode 171 positioned on both surfaces of the organic photoelectric conversion layer 160.

The organic photoelectric conversion layer 160 may be continuously formed over the plurality of pixels Px. A wavelength region of light, which the organic photoelectric conversion layer 160 may detect and photoelectrically convert, may be, for example, light in a green wavelength band, but is not limited thereto. The organic photoelectric conversion layer 160 may include a P-type semiconductor and an N-type semiconductor, and the P-type semiconductor and the N-type semiconductor may form a PN junction. At least one of the P-type semiconductor and the N-type semiconductor may include an organic material.

One first electrode 151 may be positioned for each organic photoelectric conversion element OPD, and the first electrodes 151 of the adjacent organic photoelectric conversion elements OPD may be spaced apart from each other and electrically isolated from each other.

The second electrode 171 may be continuously formed over the plurality of pixels Px. That is, the second electrode 171 may be continuously formed on a front surface of a pixel array unit 300 together with the organic photoelectric conversion layer 160. The first electrode 151 and the second electrode 171 may be transparent (e.g., formed of a thin film including a transparent conductive oxide, graphene, carbon nanotubes, a thin metal layer of about 50 nm or less, and combinations thereof)

At least one of all of the pixels Px included in the pixel array unit may be an autofocusing pixel PF and the remaining pixels Px may be normal pixels PN. FIG. 19 illustrates the adjacent autofocusing pixel PF and normal pixel PN.

The autofocusing pixel PF may include a plurality of sub areas Pa and Pb, and each of the plurality of sub areas Pa and Pb may include one organic photoelectric conversion element OPD. That is, the first sub area Pa of the autofocusing pixel PF may include a first organic photoelectric conversion element OPD1 including one first electrode 151, and the second sub area Pb of the autofocusing pixel PF may include a second organic photoelectric conversion element OPD2 including one first electrode 151.

Referring to FIG. 19, the first electrode 151 of each of the first and second organic photoelectric conversion elements OPD1 and OPD2 may be connected to a charge storing area 126 of the semiconductor substrate 120A through a connection member 115 that is a conductor. The charges generated by the photoelectric conversion by the first and second organic photoelectric conversion elements OPD1 and OPD2 may be collected in the charge storing area 126 through the connection member 115. The connection member 115 may include a metal and the like. The charge storing area 126 may be positioned in a neighboring area of the first surface BS of the semiconductor substrate 120A.

Unlike the illustration of FIG. 19, the connection member 115 may also be (or may alternatively be) positioned at a place adjacent to a border of each pixel Px. In this case, the connection member 115 may not overlap the photoelectric conversion elements PD3 and PD4 of the semiconductor substrate 120A in a plane structure. Further, the connection member 115 may be further extended in a down direction and be formed up to the second surface FS of the semiconductor substrate 120A. According to some example embodiments, the connection member 115 may also be (or may alternatively be) connected with a conductive member (not illustrated), which is formed from the first surface BS of the semiconductor substrate 120A to a neighboring area of the second surface FS, in the first surface BS. In this case, the charge storing area 126 may be positioned in a neighboring area of the second surface FS of the semiconductor substrate 120A.

The normal pixel PN may not include a plurality of sub areas, and may include one organic photoelectric conversion element OPD.

The semiconductor substrate 120A may include at least one photoelectric conversion element PD3 and PD4 positioned in each pixel Px. Each of the photoelectric conversion elements PD3 and PD4 positioned in each pixel Px may overlap both the first and second organic photoelectric conversion elements OPD1 and OPD2 of the autofocusing pixel PF in the third direction Dr3, or may overlap the organic photoelectric conversion element OPD of the normal pixel PN in the third direction Dr3. The photoelectric conversion elements PD3 and PD4 may receive light, which is left after being photoelectrically converted in the organic photoelectric conversion element OPD, and photoelectrically convert the received light.

FIG. 19 illustrates an example, in which each pixel Px includes the photoelectric conversion elements PD3 and PD4 positioned in the semiconductor substrate 120A one by one. Each of the photoelectric conversion elements PD3 and PD4 may receive light of a specific wavelength band and photoelectrically convert the received light. To this end, a plurality of color filters 133 and 134 may be positioned between the semiconductor substrate 120A and the organic photoelectric conversion element OPD. Colors exhibited by the two color filters 133 and 134 positioned in the adjacent pixels Px may be different from each other. For example, when the organic photoelectric conversion layer 160 selectively photoelectrically converts light of a green wavelength band, the color filter 131 positioned in the pixel Px positioned at a left side in FIG. 19 may selectively allow light of a blue wavelength band in an area other than the green wavelength band to pass through, and the color filter 132 positioned in the pixel Px positioned at a right side in FIG. 19 may selectively allow light of a red wavelength band in the area other than the green wavelength band to pass through. Accordingly, the photoelectric conversion element PD3 included in the pixel Px positioned at the left side in FIG. 19 may detect and photoelectrically convert blue light, and the photoelectric conversion element PD4 included in the pixel Px positioned at the right side in FIG. 19 may detect and photoelectrically convert red light. The colors exhibited by the plurality of color filters 133 and 134 may also be (or may alternatively be) other colors, other than blue and red.

Unlike the illustration of FIG. 19, each pixel Px may include a plurality of photoelectric conversion elements (not illustrated) overlapping the organic photoelectric conversion element OPD in the third direction Dr3. The plurality of photoelectric conversion elements positioned in each pixel Px may overall one another in the third direction Dr3. At least one of the plurality of photoelectric conversion elements may also be (or may alternatively be) an inorganic photoelectric conversion element including a semiconductor material, or may also be (or may alternatively be) an organic photoelectric conversion element. The plurality of photoelectric conversion elements positioned in one pixel Px may receive light of a different wavelength band according to a position thereof.

One micro-lens ML may be positioned on the first and second organic photoelectric conversion elements OPD1 and OPD2 of each autofocusing pixel PF, and one micro-lens ML may be positioned on the organic photoelectric conversion element OPD of each normal pixel PN.

An insulating layer 140A may be further positioned between the organic photoelectric conversion element OPD and the micro-lens ML, and the insulating layer 140A may be a planarizing layer.

A wiring layer 110A may be positioned between the first surface BS of the semiconductor substrate 120A and the organic photoelectric conversion element OPD. The wiring layer 110A may include a plurality of transistors included in the pixel Px and several wires connected to the plurality of transistors. The signal photoelectrically converted in the organic photoelectric conversion element OPD and the photoelectric conversion elements PD3 and PD4 may be read out in the wiring layer 110A.

The connection member 115 connected with the first electrode 151 of the organic photoelectric conversion element OPD may be formed while passing through an insulating layer 111 included in the wiring layer 110A.

According to some example embodiments, the illustrated wiring layer 110A may also be (or may alternatively be) positioned under the second surface FS of the semiconductor substrate 120A. In this case, a separate insulating layer (not illustrated) may be positioned between the semiconductor substrate 120A and the organic photoelectric conversion element OPD. Further, a conductive connection member (not illustrated) connected with the first electrode 151 of the organic photoelectric conversion element OPD may be formed while passing through the insulating layer and the semiconductor substrate 120A. In this case, the first electrode 151 of the organic photoelectric conversion element OPD may be connected with the charge storing area (not illustrated) of the semiconductor substrate 120A through the conductive connection member and transmit charges.

The first and second organic photoelectric conversion elements OPD1 and OPD2 included in the autofocusing pixel PF may share one floating diffusion node (not illustrated) and output the photoelectrically converted signal through the same output signal line (not illustrated).

The first and second organic photoelectric conversion elements OPD1 and OPD2 included in the autofocusing pixel PF may be connected to the two transmission transistors connected to the two transmission signal lines, respectively, like the first and second photoelectric conversion elements PD1 and PD2 of the autofocusing pixel PF illustrated in FIG. 12. Accordingly, the first and second organic photoelectric conversion elements OPD1 and OPD2 included in the autofocusing pixel PF may output the photoelectrically converted signals of the first and second organic photoelectric conversion elements OPD1 and OPD2 as first and second sub pixel signals at two different timings, respectively, through one floating diffusion node FD and one driving transistor DX. It is possible to perform the autofocusing control function by detecting a phase difference by using the read-out first and second sub pixel signals, and obtain green image data (when the organic photoelectric conversion layer detects green light) for the corresponding pixel Px in addition to the first and second sub pixel signals. In contrast to this, as illustrated in FIG. 14, the photoelectrically converted signal of one of the first and second organic photoelectric conversion elements OPD1 and OPD2 may be output at one timing between the two different timings, and the photoelectrically converted signals of both the first and second organic photoelectric conversion elements OPD1 and OPD2 may be added and output at the remaining timing.

It is possible to detect a phase difference between light incident to the first and second sub areas Pa and Pb of the autofocusing pixel PF by using the obtained first and second sub pixel signals, and it is possible to obtain focus information, such as a distance to an object, whether the object is in focus, and the degree by which the object is out of focus, by using the detected phase difference. Further, the colors detected by the first and second organic photoelectric conversion elements OPD1 and OPD2 included in the autofocusing pixel PF may be freely selected according to a color characteristic, such as the color sense and a color temperature, of an object, which is to mainly use the autofocusing control function, and thus it is possible to increase accuracy of the phase difference detection and the autofocusing function.

The organic photoelectric conversion element OPD included in the normal pixel PN may be connected to one transmission signal line and read out one pixel signal.

Although not shown in FIG. 19, the normal pixel PN may also include the first and second organic photoelectric conversion elements OPD1 and OPD2 like the autofocusing pixel PF. In this case, the first and second organic photoelectric conversion elements OPD1 and OPD2 included in the normal pixel PN may be connected to two transmission transistors connected to one transmission signal line, respectively, like the normal pixel PN illustrated in FIG. 12. Accordingly, one pixel signal is read out by using one transmission signal for the normal pixel PN, so that it is possible to increase an entire readout speed of the image sensor.

Next, a pixel array unit 300 included in an image sensor according to some example embodiments will be described with reference to FIGS. 20 and 21 together with the aforementioned drawings.

Figure 20:
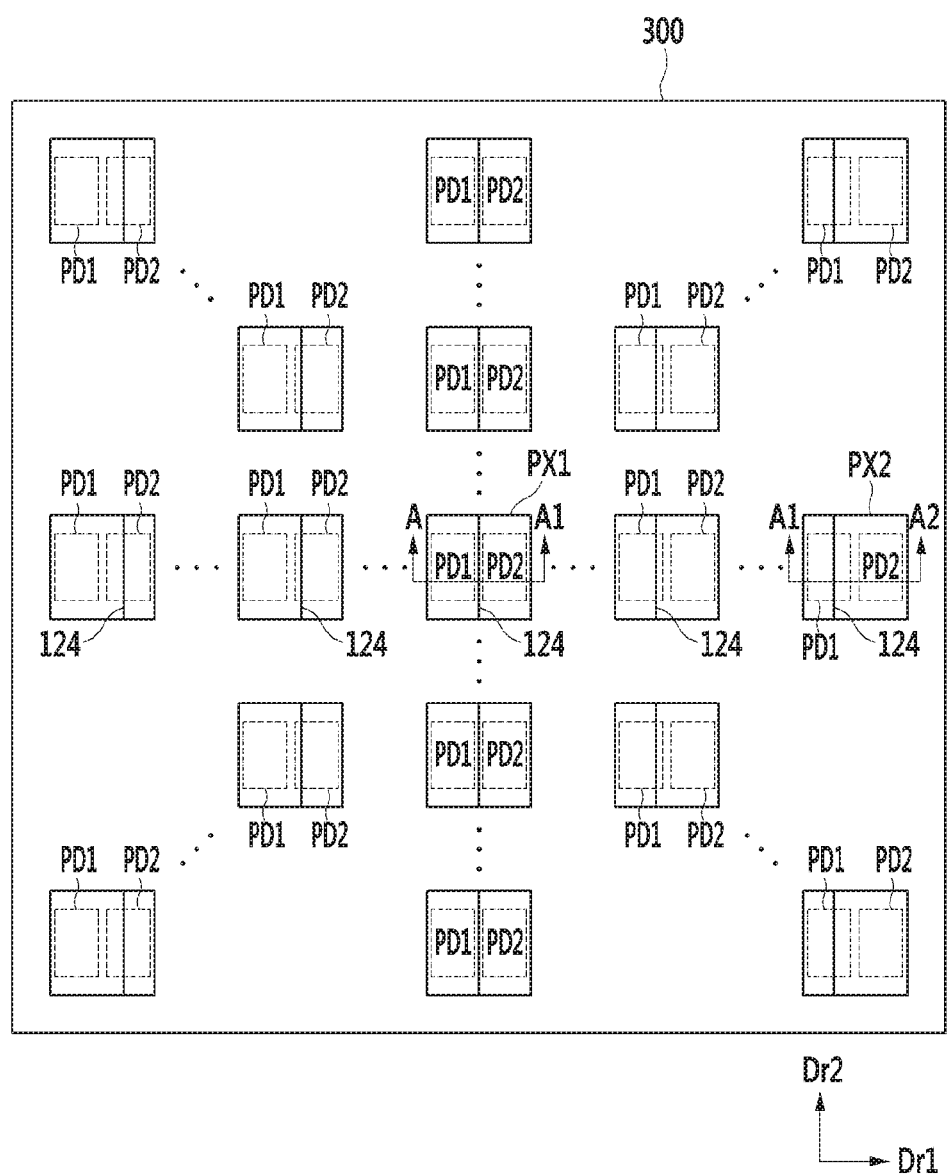
FIG. 20 is a layout view of a pixel array unit included in the image sensor according to some example embodiments.
Figure 21:
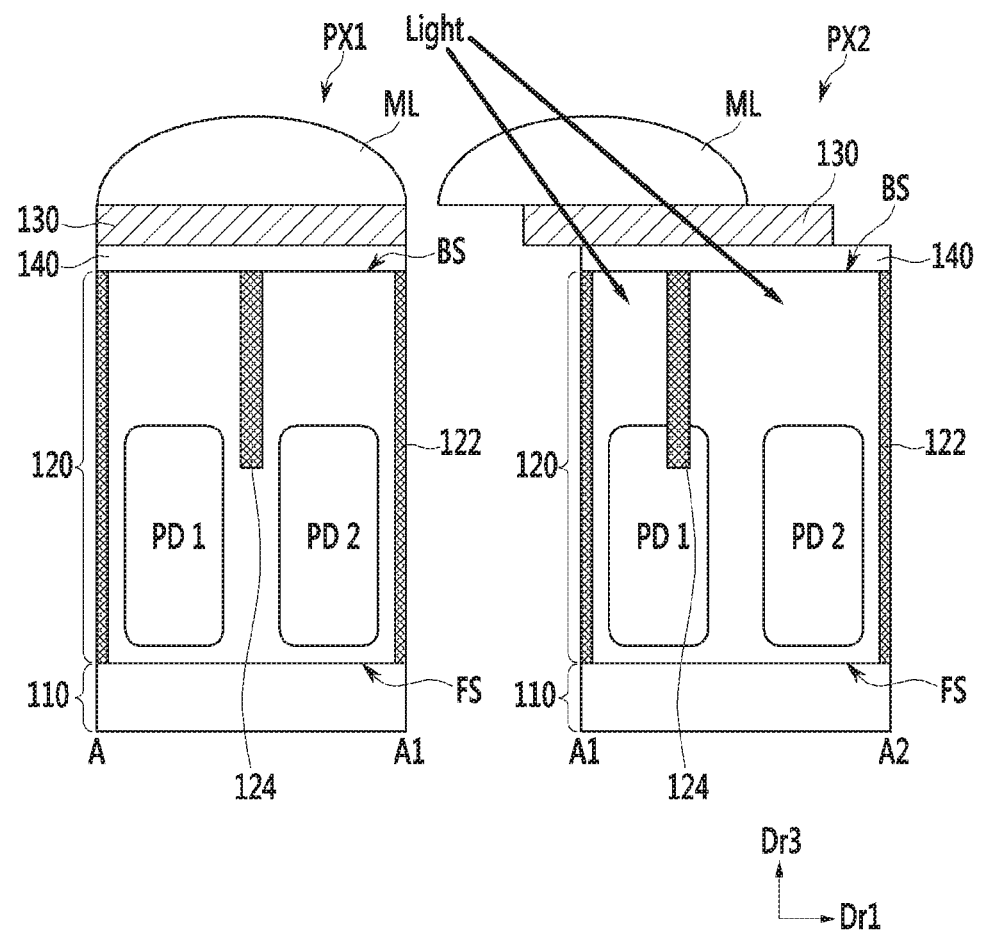
FIG. 21 is a cross-sectional view illustrating two pixels of the pixel array unit illustrated in FIG. 20 taken along lines A-A1 and A1-A2.

Referring to FIGS. 20 and 21, the pixel array unit 300 according to some example embodiments may include a semiconductor substrate 120 including first and second photoelectric conversion elements PD1 and PD2, a wiring layer 110, a color filter 130, a micro-lens ML, an insulating layer 140, and the like. In some example embodiments, the semiconductor substrate 120, the wiring layer 110, the color filter 130, the micro-lens ML, and the insulating layer 140 are mostly the same as the corresponding configurations described above, but a position of a second isolator 124 on a plane may be different according to a position of a pixel Px.

In some example embodiments, when the first and second photoelectric conversion elements PD1 and PD2 within one pixel PX1 or PX2 are adjacently arranged in the first direction Dr1 and the second isolator 124 positioned between the first and second photoelectric conversion elements PD1 and PD2 is approximately extended in the second direction Dr2, a position of the second isolator 124 within the pixel PX1 or PX2 in the first direction Dr1 may be changed according to a position of the corresponding pixel PX1 or PX2 in the pixel array unit 300.

Referring to FIGS. 20 and 21, when a pixel approximately positioned on a center vertical line of the pixel array unit 300 is referred to as a first pixel PX1 and a pixel Px positioned at a border of the same row as that of the first pixel PX1 is referred to as a second pixel PX2, the second isolator 124 included in the first pixel PX1 may be approximately positioned at a center of the first pixel PX1 on a plane, and the second isolator 124 included in the second pixel PX2 may deviate from the center of the second pixel PX2 and slantly (and/or diagonally) positioned toward a border facing the first pixel PX1. In the most pixels Px, sizes of the first and second photoelectric conversion elements PD1 and PD2 may be approximately the same as each other.

A position of the second isolator 124 within each pixel PX1 or PX2 in the first direction Dr1 with respect to a center of each of the pixels PX1 and PX2 may be gradually changed from the vertical center line of the pixel array unit 300 to left and right borders, and a direction, in which the second isolator 124 gradually moves, may be a direction heading the vertical center line of the pixel array unit 300.

Referring to FIG. 21, positions of the color filter 130 and the micro-lens ML positioned on the semiconductor substrate 120 with respect to the center of each of the pixels PX1 and PX2 in the first direction Dr1 may also be changed according to a position of the pixel, like the second isolator 124. That is, the centers of the color filter 130 and the micro-lens ML positioned in the first pixel PX1 may approximately correspond to the center of the first pixel PX1, and the centers of the color filter 130 and the micro-lens ML included in the second pixel PX2 may deviate from the center of the second pixel PX2 and be slantly (and/or diagonally) positioned toward the first pixel PX1.

The positions of the color filter 130 and the micro-lens ML with respect to a center of each pixel in the first direction Dr1 may be gradually changed from the vertical center line of the pixel array unit 300 to left and right boarders, and the direction, in which the color filter 130 and the micro-lens ML gradually move, may be a direction heading the vertical center line of the pixel array unit 300. Further, the quantity of position change of the color filter 130 in the first direction Dr1 may be larger than the quantity of position change of the micro-lens ML in the first direction Dr1. Accordingly, as illustrated in FIG. 21, the micro-lens ML positioned in the second pixel PX2 has been further moved than the color filter 130 under the micro-lens ML.

When the second isolators 124, the color filters 130, and the micro-lenses ML of all of the pixels included in the pixel array unit 300 have the same positions within the corresponding pixel, a difference in the quantity of received light of each of the first and second photoelectric conversion elements PD1 and PD2 included in the pixel positioned at the center of the pixel array unit 300 is small, but there may be a difference in the quantity of received light of each of the first and second photoelectric conversion elements PD1 and PD2 included in the pixel positioned at the border of the pixel array unit 300.

However, according to some example embodiments, the positions of the second isolator 124, the color filter 130, and the micro-lens ML with respect to the corresponding pixel PX1 or PX2 are gradually changed according to the position of the pixel PX1 or PX2, so that as illustrated in FIG. 21, even when light is slantly (and/or diagonally) incident from the side, it is possible to reduce and/or minimize a difference in the quantity of light incident into the first and second photoelectric conversion elements PD1 and PD2. Accordingly, it is possible to decrease a defect of the image, the phase difference, and the autofocusing information obtained from the autofocusing pixel PF or the normal pixel PN positioned around the pixel array unit 300.

In the cross-sectional structure illustrated in FIG. 21, the second isolator 124 may be extended to an inner side of the first or second photoelectric conversion elements PD1 or PD2, but is not limited thereto, and a lower surface of the second isolator 124 may also be (or may alternatively be) spaced apart from an upper surface of the first or second photoelectric conversion element PD1 or PD2.

Next, a pixel array unit 300 included in an image sensor according to some example embodiments will be described with reference to FIGS. 22 and 23 together with FIGS. 20 and 21.

Figure 22:
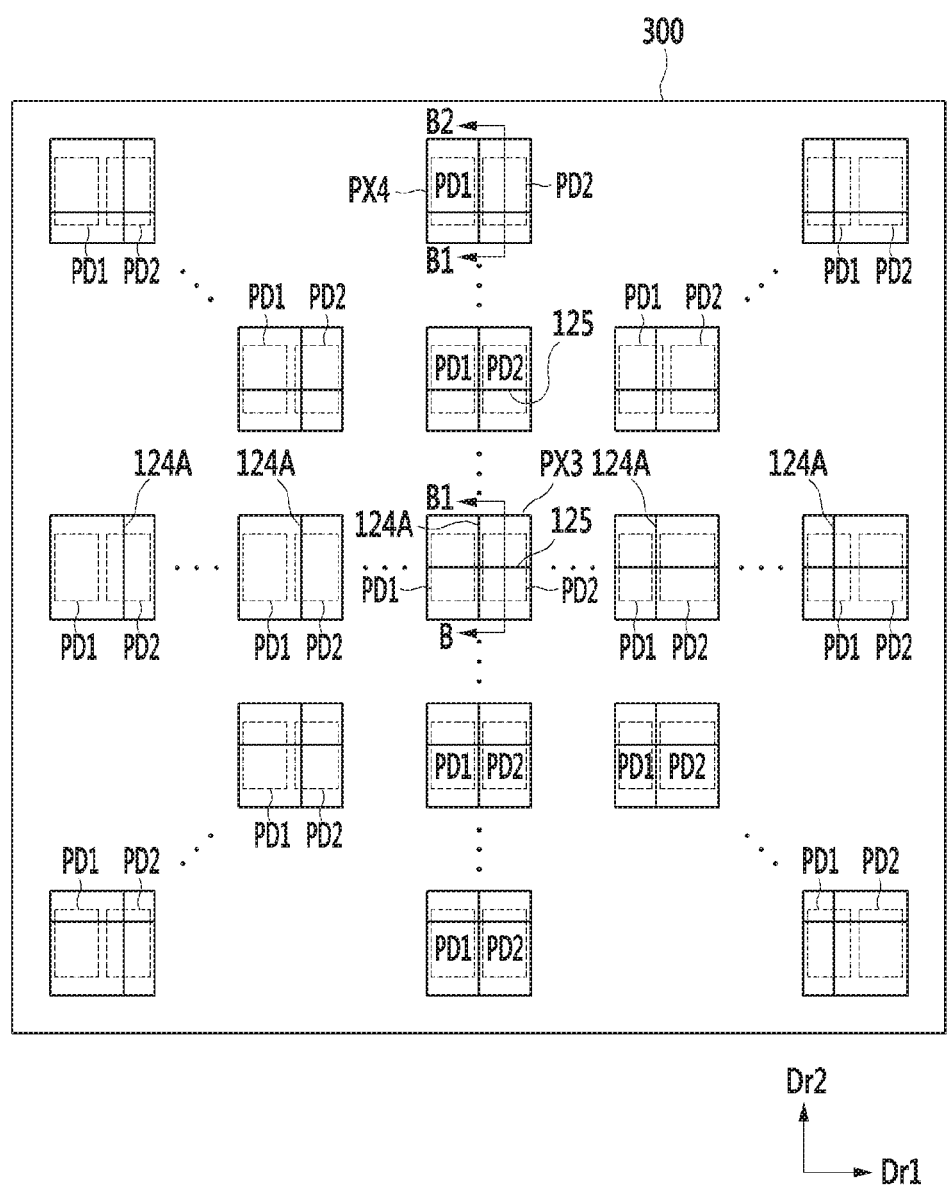
FIG. 22 is a layout view of a pixel array unit included in an image sensor according to some example embodiments.
Figure 23:
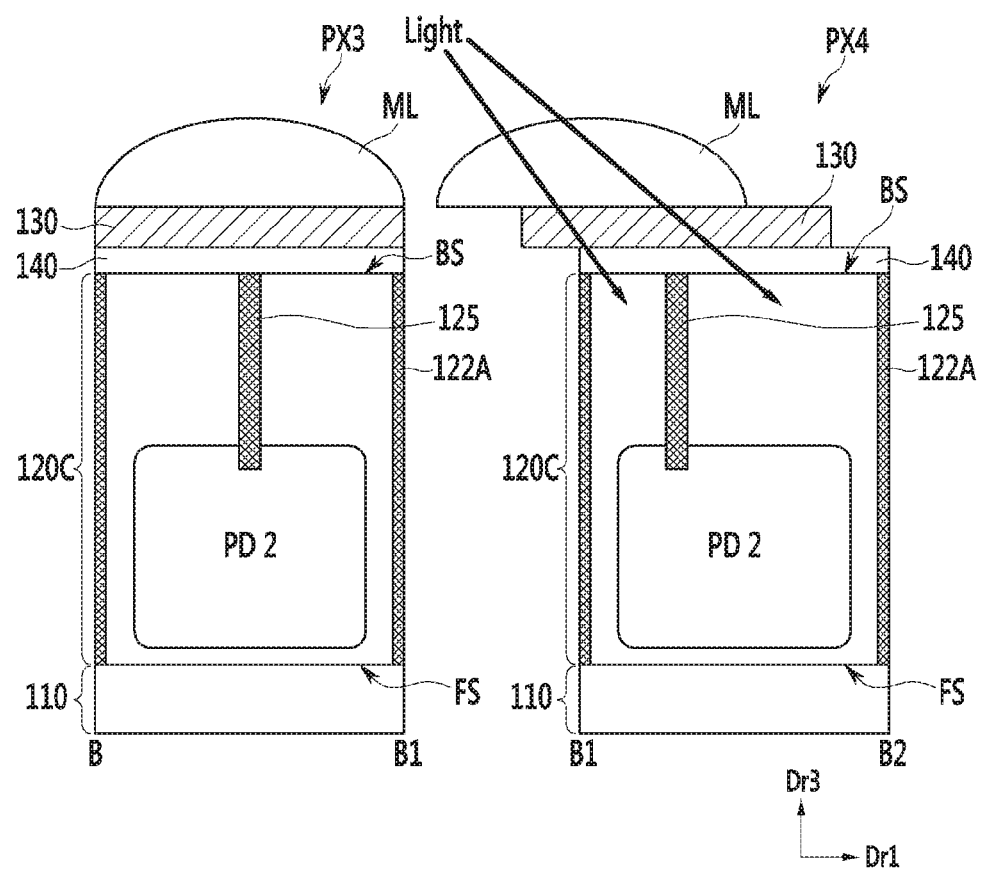
FIG. 23 is a cross-sectional view illustrating two pixels of the pixel array unit illustrated in FIG. 22 taken along lines B-B1 and B1-B2.

Referring to FIGS. 22 and 23, the pixel array unit 300 according to some example embodiments may include a semiconductor substrate 120C including first and second photoelectric conversion elements PD1 and PD2, a wiring layer 110, a color filter 130, a micro-lens ML, an insulating layer 140, and the like, and the semiconductor substrate 120C may include a first isolator 122A and a second isolator 124A. In some example embodiments, the semiconductor substrate 120C, the wiring layer 110, the color filter 130, the micro-lens ML, and the insulating layer 140 are mostly the same as the corresponding configurations described above, but the pixel array unit 300 may further include a third isolator 125 positioned within each of the pixels PX3 and PX4.

The structures of the first isolator 122A and the second isolator 124A may be mostly the same as those described above illustrated in FIGS. 20 and 21.

The third isolator 125 may be positioned within the semiconductor substrate 120C and may be approximately extended in the first direction Dr1 on a plane structure, but is not limited thereto. The third isolator 125 may cross the first and second photoelectric conversion elements PD1 and PD2 in the first direction Dr1. The third isolator 125 may also be (or may alternatively be) connected with or spaced apart from the first isolator 122A.

In the cross-sectional structure illustrated in FIG. 23, the third isolator 125 may be extended to an inner side of the first or second photoelectric conversion elements PD1 or PD2, but is not limited thereto, and a lower surface of the third isolator 125 may also be (or may alternatively be) spaced apart from an upper surface of the first or second photoelectric conversion elements PD1 or PD2. A depth of the third isolator 125 from the first surface BS of the semiconductor substrate 120C may be approximately the same as a depth of the second isolator 124A.

A position of the third isolator 125 according to some example embodiments with respect to a center of the pixel PX3 or PX4 may be changed according to the position of the pixel PX3 or PX4 like the same scheme as that of the second isolator 124A described above, but a movement direction of the third isolator 125 may be different.

When a pixel approximately positioned on a center horizontal line of the pixel array unit 300 is referred to as the third pixel PX3 and a pixel positioned in the same column as that of the third pixel PX and positioned at a border of the pixel array unit 300 is referred to as the fourth pixel PX4, the third isolator 125 included in the third pixel PX3 may be approximately positioned at a center of the third pixel PX3, and the third isolator 125 included in the fourth pixel PX4 may deviate from the center of the fourth pixel PX4 and be slantly (and/or diagonally) positioned toward the border facing the third pixel PX3 in a plane structure. A position of the third isolator 125 within each of the pixels PX3 and PX4 in the second direction Dr2 may be gradually changed from the horizontal center line of the pixel array unit 300 to upper and lower borders of the pixel array unit 300, and the gradual movement direction of the third isolator 125 may be a direction facing the horizontal center line of the pixel array unit 300.

Referring to FIG. 23, the color filter 130 and the micro-lens ML positioned on the semiconductor substrate 120C may have the same position change as that of the example in FIGS. 20 and 21, and the positions of the color filter 130 and the micro-lens ML in the second direction Dr2 may also be (or may alternatively be) changed according to the position of the pixel like the third isolator 125. That is, the centers of the color filter 130 and the micro-lens ML positioned so as to correspond to the third pixel PX3 may approximately correspond to the center of the third pixel PX3, and the centers of the color filter 130 and the micro-lens ML included in the fourth pixel PX4 may deviate from the center of the fourth pixel PX4 and slantly (and/or diagonally) positioned toward the third pixel PX3.

The positions of the color filter 130 and the micro-lens ML with respect to a center of each pixel in the second direction Dr3 may be gradually changed from the horizontal center line of the pixel array unit 300 to upper and lower boarders of the pixel array unit 300, and the direction, in which the color filter 130 and the micro-lens ML gradually move, may be a direction heating the horizontal center line of the pixel array unit 300. Further, the quantity of position change of the color filter 130 in the second direction Dr2 may be larger than the quantity of position change of the micro-lens ML in the second direction Dr2. Accordingly, as illustrated in FIG. 23, the micro-lens ML positioned in the fourth pixel PX4 has been further moved than the color filter 130 under the micro-lens ML.

Last, an electronic device including an image sensor according to some example embodiments will be described with reference to FIG. 24.

Figure 24:
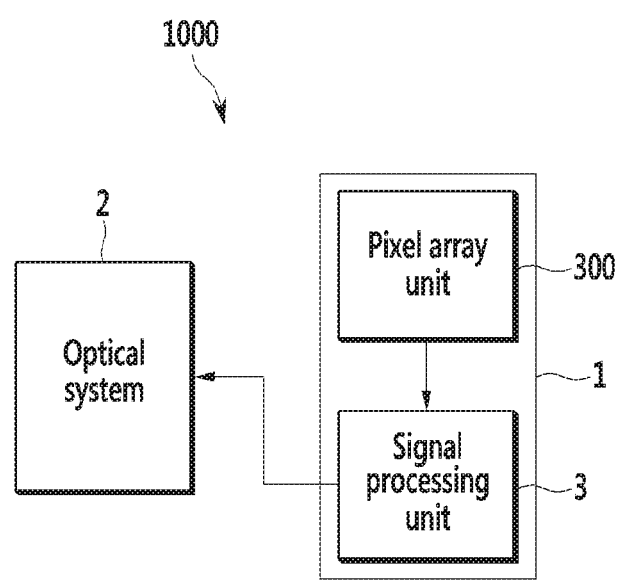
FIG. 24 is a schematic block diagram of an electronic device including an image sensor according to some example embodiments.

Referring to FIG. 24, an electronic device 1000 according to some example embodiments may include an image sensor 1 according to some example embodiments of the present disclosure, an optical system 2 including at least one photographing lens, and the like.

In some example embodiments, the image sensor 1 may further include a signal processing unit 3. The signal processing unit 3 may include the first driver 400, the second driver 500, and the timing controller 600, which are described above. The signal processing unit 3 may receive first and second sub pixel signals from a pixel array unit 300, and detect a phase difference for an object. The signal processing unit 3 may determine autofocusing information, such as a distance from the pixel array unit 300 to the object, whether the object is in focus, and the degree by which the object is out of focus, by using the detected phase difference. According to a result of the determination, the signal processing unit 3 may transmit a control signal to the optical system 2 and control a focus of the optical system 2. The focus of the optical system 2 may be adjusted by controlling a distance between the lens and the pixel array unit 300, and the like. After the adjustment of the focus, the image sensor 1 may detect an image and obtain image data having high resolution image quality. The electronic device 1000 may be a digital camera, a camcorder, a robot, and the like.

While some example embodiments have been particularly shown and described, it will be understood by one of ordinary skill in the art that variations in form and detail may be made therein without departing from the spirit and scope of the claims.

What is claimed is:

1. A method of driving an image sensor, the image sensor including a plurality of pixels, the plurality of pixels including at least one autofocusing pixel and at least one normal pixel, each of the plurality of pixels including a plurality of photoelectric conversion elements, the method comprising:
reading out autofocusing pixel signals, which are photoelectrically converted by the plurality of photoelectric conversion elements included in one of the at least one autofocusing pixel, respectively, at different timings, wherein the reading out the autofocusing pixel signals includes
applying a first transmission signal activated at a first timing to the at least one autofocusing pixel, and
applying a second transmission signal activated at a second timing different from the first timing to the at least one autofocusing pixel; and
reading out normal pixel signals, which are photoelectrically converted by the plurality of photoelectric conversion elements included one of the at least one normal pixels, respectively, simultaneously.

2. The method of claim 1, wherein the reading out the autofocusing pixel signals includes applying the first transmission signal activated at the second timing to the at least one autofocusing pixel.

3. The method of claim 1, wherein
the reading out the normal pixel signals includes applying a third transmission signal activated at a third timing after the second timing to the at least one normal pixel.

4. The method of claim 1, wherein the reading out the autofocusing pixel signals includes:
obtaining a first sub pixel signal and a second sub pixel signal; and
detecting a phase difference between light incident to a first sub area and a second sub area of the at least one autofocusing pixel, based on the first sub pixel signal and the second sub pixel signal, wherein
the first sub area includes a first photoelectric conversion element among the plurality of photoelectric conversion elements of the at least one autofocusing pixel, and
the second sub area includes a second photoelectric conversion element among the plurality of photoelectric conversion elements of the at least one autofocusing pixel.

5. The method of claim 4, wherein the obtaining the first sub pixel signal and the second sub pixel signal includes:
reading out the first sub pixel signal between the first timing and the second timing; and
reading out the second sub pixel signal after the second timing.

6. The method of claim 5, wherein
the second transmission signal is deactivated at the first timing, and
the first transmission signal is deactivated at the second timing.

7. The method of claim 4, wherein the obtaining the first sub pixel signal and the second sub pixel signal includes:
reading out the first sub pixel signal between the first timing and the second timing;
reading out a sum of the first sub pixel signal and the second sub pixel signal after the second timing; and
calculating a subtraction between the sum and the first sub pixel signal to obtain the second sub pixel signal.

8. The method of claim 7, wherein
the second transmission signal is deactivated at the first timing, and
the first transmission signal is activated at the second timing.

9. The method of claim 4, wherein:
the first sub pixel signal corresponds to photocharges generated by the first photoelectric conversion element, and
the second sub pixel signal corresponds to photocharges generated by the second photoelectric conversion element.

10. The method of claim 4, further comprising:
determining autofocusing information corresponding to an external object based on the phase difference.

11. A method of driving an image sensor, the image sensor including a plurality of pixels, the plurality of pixels including at least one autofocusing pixel and at least one normal pixel, each of the plurality of pixels including a plurality of photoelectric conversion elements, the method comprising:
applying a first transmission signal activated at a first timing to the at least one autofocusing pixel to obtain a first sub pixel signal;
applying a second transmission signal activated at a second timing different from the first timing to the at least one autofocusing pixel to obtain a second sub pixel signal;
applying a third transmission signal activated at a third timing different from the second timing to the at least one normal pixel to obtain a pixel signal;
obtaining image data corresponding to at least one autofocusing pixel by using a sum of the first sub pixel signal and the second sub pixel signal; and
obtaining image data corresponding to at least one normal pixel by using the pixel signal.

12. The method of claim 11, wherein the second timing is later than the first timing and earlier than the third timing.

13. The method of claim 11, wherein
the at least one autofocusing pixel includes a first sub area and a second sub area,
the first sub pixel signal corresponds to photocharges of the first sub area, and
the second sub pixel signal corresponds to photocharges of the second sub area.

14. The method of claim 13, further comprising:
detecting a phase difference between light incident to the first sub area and a second sub area of the at least one autofocusing pixel, based on the first sub pixel signal and the second sub pixel signal; and
determining autofocusing information corresponding to an external object based on the phase difference.

15. The method of claim 13, wherein:
the at least one autofocusing pixel includes a floating diffusion node; and
in one of the at least one autofocusing pixel, the photocharges of the first sub area are transmitted to the floating diffusion node in response to activation of the first transmission signal and the photocharges of the second sub area are transmitted to the floating diffusion node in response to activation of the second transmission signal.

16. The method of claim 15, wherein:
the floating diffusion node stores the photocharges of the first sub area, between the first timing and the second timing; and
the floating diffusion node stores the photocharges of the first sub area and the photocharges of the second sub area, after the second timing.

17. The method of claim 11, wherein
the applying the first transmission signal includes applying the first transmission signal to a first transmission transistor of the at least one autofocusing pixel;
the applying the second transmission signal includes applying the second transmission signal to a second transmission transistor of the at least one autofocusing pixel, the second transmission transistor being different from the first transmission transistor; and
the applying the third transmission signal includes applying the third transmission signal to transmission transistors of the at least one normal pixel, simultaneously.

18. The method of claim 11, wherein:
the third timing is the same as the first timing.

19. The method of claim 18, wherein:
the third transmission signal is the same as the first transmission signal.

\* \* \* \* \*